(12) United States Patent
Wang et al.

(10) Patent No.: US 11,817,352 B2
(45) Date of Patent: Nov. 14, 2023

(54) METHOD OF FABRICATING REDISTRIBUTION CIRCUIT STRUCTURE

(71) Applicant: Taiwan Semiconductor Manufacturing Co., Ltd., Hsinchu (TW)

(72) Inventors: Po-Han Wang, Hsinchu (TW); Yu-Hsiang Hu, Hsinchu (TW); Hung-Jui Kuo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 20 days.

(21) Appl. No.: 17/409,010

(22) Filed: Aug. 23, 2021

(65) Prior Publication Data
US 2021/0384075 A1    Dec. 9, 2021

Related U.S. Application Data

(63) Continuation of application No. 16/415,437, filed on May 17, 2019, now Pat. No. 11,101,176.
(Continued)

(51) Int. Cl.
*H01L 21/768* (2006.01)
*H01L 23/00* (2006.01)
(Continued)

(52) U.S. Cl.
CPC ...... *H01L 21/76898* (2013.01); *H01L 21/563* (2013.01); *H01L 21/76873* (2013.01); *H01L 21/76885* (2013.01); *H01L 23/3171* (2013.01); *H01L 23/481* (2013.01); *H01L 23/5226* (2013.01); *H01L 23/5283* (2013.01); *H01L 23/5329* (2013.01); *H01L 24/09* (2013.01); *H01L 2224/0231* (2013.01); *H01L 2224/02373* (2013.01); *H01L 2224/02379* (2013.01); *H01L 2224/02381* (2013.01)

(58) Field of Classification Search
CPC ... H01L 24/18–24; H01L 2224/21–214; H01L 2224/22–224; H01L 2224/73267; H01L 2224/04105; H01L 2224/73265; H01L 23/5389
See application file for complete search history.

(56) References Cited

U.S. PATENT DOCUMENTS

| | | | |
|---|---|---|---|
| 6,673,698 B1 * | 1/2004 | Lin | H01L 24/97 438/459 |
| 8,975,741 B2 | 3/2015 | Lin et al. | |

(Continued)

FOREIGN PATENT DOCUMENTS

| | | | | |
|---|---|---|---|---|
| CN | 102439719 | * | 5/2012 | .......... H01L 25/065 |
| CN | 103050486 A | | 4/2013 | |

(Continued)

*Primary Examiner* — John A Bodnar
(74) *Attorney, Agent, or Firm* — Slater Matsil, LLP

(57) ABSTRACT

A method of fabricating a redistribution circuit structure including the following steps is provided. A conductive via is formed. A photosensitive dielectric layer is formed to cover the conductive via. The photosensitive dielectric layer is partially removed to reveal the conductive via at least through an exposure and development process. A redistribution wiring is formed on the photosensitive dielectric layer and the revealed conductive via.

20 Claims, 21 Drawing Sheets

Related U.S. Application Data

(60) Provisional application No. 62/691,721, filed on Jun. 29, 2018.

(51) Int. Cl.
  *H01L 23/48* (2006.01)
  *H01L 23/522* (2006.01)
  *H01L 23/528* (2006.01)
  *H01L 23/31* (2006.01)
  *H01L 21/56* (2006.01)
  *H01L 23/532* (2006.01)

(56) References Cited

U.S. PATENT DOCUMENTS

| | | |
|---|---|---|
| 2008/0237828 A1 | 10/2008 | Yang |
| 2012/0068313 A1 | 3/2012 | Pagaila et al. |
| 2013/0093078 A1* | 4/2013 | Lin .................. H01L 24/92 257/737 |
| 2015/0259194 A1 | 9/2015 | Lin et al. |
| 2015/0287708 A1 | 10/2015 | Lin et al. |

FOREIGN PATENT DOCUMENTS

| | | |
|---|---|---|
| CN | 105244307 A | 1/2016 |
| CN | 107068574 A | 8/2017 |
| KR | 970023828 A | 5/1997 |
| KR | 20020043959 A | 6/2002 |
| KR | 20150106815 A | 9/2015 |

\* cited by examiner

METHOD OF FABRICATING REDISTRIBUTION CIRCUIT STRUCTURE

PRIORITY CLAIM AND CROSS-REFERENCE

This application is a continuation of U.S. patent application Ser. No. 16/415,437, filed on May 17, 2019, now U.S. Pat. No. 11,101,176, which claims the benefit of U.S. Provisional Application No. 62/691,721, filed on Jun. 29, 2018, each application is hereby incorporated herein by reference.

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. The ultra-high-density (UHD) redistribution circuit structures in the integrated fan-out packages may include copper vias, redistribution wirings and dielectric layers, wherein the planarization of the dielectric layers is accomplished by a chemical mechanical polishing (CMP) process, which increase fabrication costs and impacts the productivity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
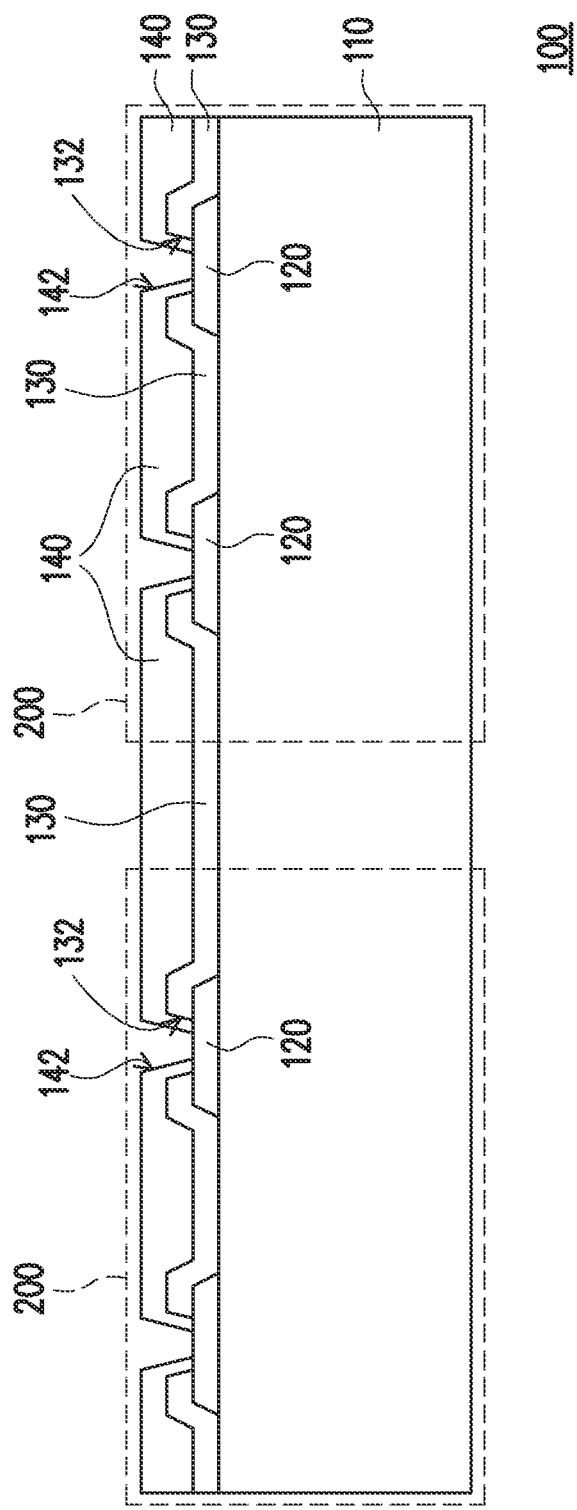
FIGS. 1 through 21 illustrate a process flow for fabricating an integrated fan-out package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1 through 21 illustrate a process flow for fabricating an integrated fan-out package in accordance with some embodiments of the present disclosure. FIGS. 22A through 22D are enlarged views of region X illustrated in FIG. 11 through FIG. 14 in accordance with some embodiments of the present disclosure.

Referring to FIG. 1, a wafer 100 including a plurality of semiconductor dies or integrated circuit components 200 arranged in, for example, an array is provided. Before a wafer dicing process is performed on the wafer 100, the integrated circuit components 200 of the wafer 100 are connected one another. In some embodiments, the wafer 100 includes a semiconductor substrate 110, a plurality of conductive pads 120 formed on the semiconductor substrate 110, and a passivation layer 130. The passivation layer 130 is formed over the substrate 110 and has a plurality of contact openings 132 such that the conductive pads 120 are partially exposed by the contact openings 132 of the passivation layer 130. For example, the semiconductor substrate 110 may be a silicon substrate including active components (e.g., transistors or the like) and passive components (e.g., resistors, capacitors, inductors or the like) formed therein; the conductive pads 120 may be aluminum pads, copper pads or other suitable metal pads; and the passivation layer 130 may be a silicon oxide layer, a silicon nitride layer, a silicon oxy-nitride layer or a dielectric layer formed by other suitable dielectric materials.

As shown in FIG. 1, in some embodiments, the wafer 100 may optionally include a post-passivation layer 140 formed over the passivation layer 130. The post-passivation layer 140 covers the passivation layer 130 and has a plurality of contact openings 142. The conductive pads 120 exposed by the contact openings 132 of the passivation 130 are partially exposed by the contact openings 142 of the post passivation layer 140. For example, the post-passivation layer 140 may be a polyimide (PI) layer, a polybenzoxazole (PBO) layer, or a dielectric layer formed by other suitable polymers.

Figure 2:
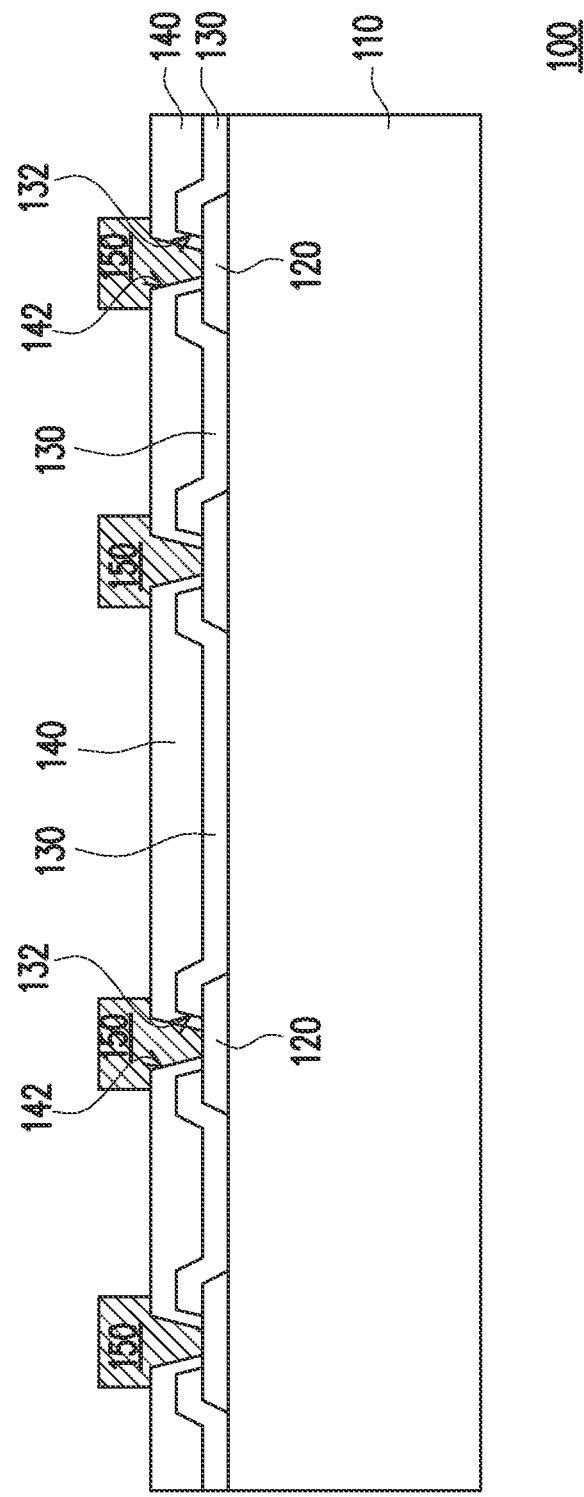

Referring to FIG. 2, a plurality of conductive pillars 150 are formed on the conductive pads 120. In some embodiments, the conductive pillars 150 are plated on the conductive pads 120. The plating process of conductive pillars 150 is described in detail below. First, a seed layer is sputtered onto the post-passivation layer 140 and the conductive pads 120 exposed by the contact openings 142. A patterned photoresist layer (not shown) is then formed over the seed layer by photolithography, wherein the patterned photoresist layer exposes portions of the seed layer that are corresponding to the conductive pads 120. The wafer 100 including the patterned photoresist layer formed thereon is then immersed into a plating solution of a plating bath such that the conductive pillars 150 are plated on the portions of the seed layer that are corresponding to the conductive pads 120. After the plated conductive pillars 150 are formed, the patterned photoresist layer is stripped. Thereafter, by using the conductive pillars 150 as a hard mask, portions of the seed layer that are not covered by the conductive pillars 150 may be removed through etching until the post passivation layer 140 is exposed, for example. In some embodiments, the conductive pillars 150 are plated copper pillars.

Figure 3:
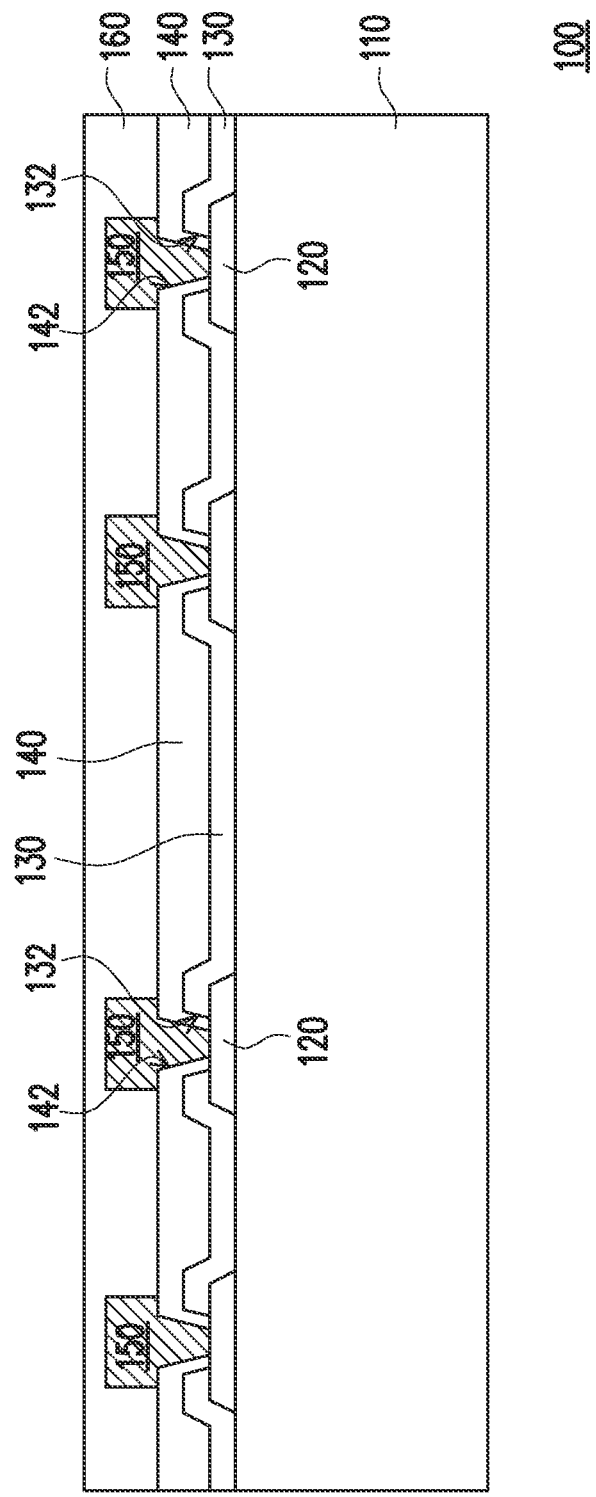

Referring to FIG. 3, after the conductive pillars 150 are formed, a protection layer 160 is formed on the post passivation layer 140 so as to cover the conductive pillars 150. In some embodiments, the protection layer 160 may be a polymer layer having sufficient thickness to encapsulate and protect the conductive pillars 150. For example, the protection layer 160 may be a polybenzoxazole (PBO) layer, a polyimide (PI) layer or other suitable polymers. In some alternative embodiments, the protection layer 160 may be made of inorganic materials.

Figure 4:
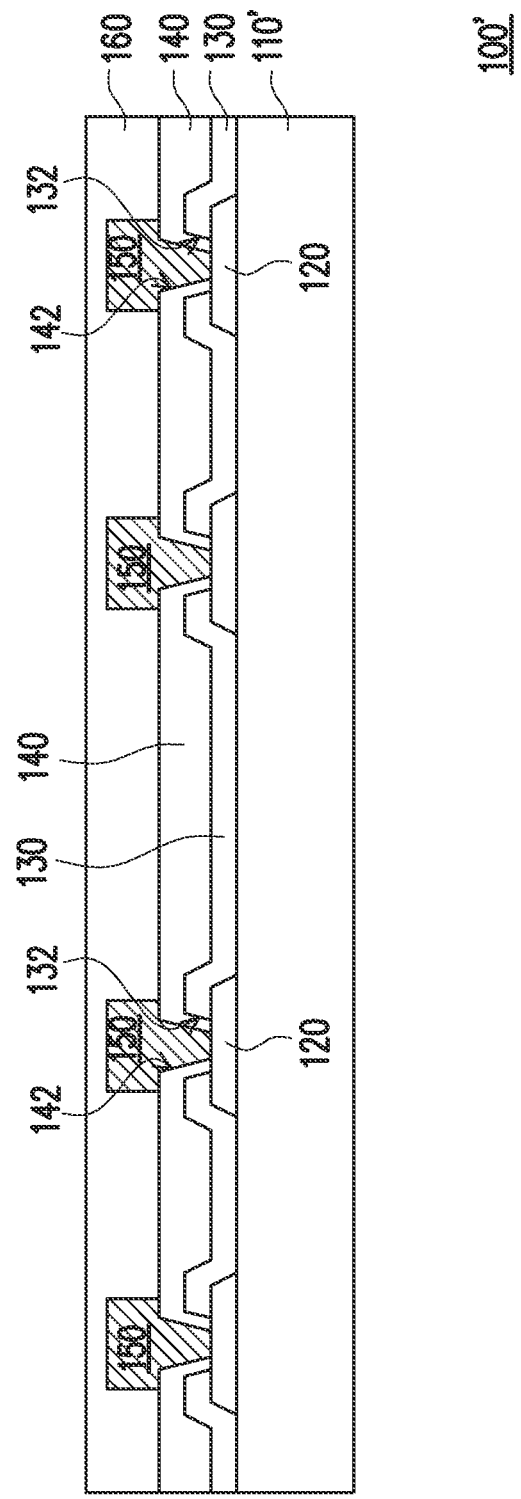

Referring to FIG. 4, a back side grinding process is performed on the rear surface of the wafer 100 after the protection layer 160 is formed. During the back side grinding process, the semiconductor substrate 110 is ground such that a thinned wafer 100' including a thinned semiconductor substrate 110' is formed.

Figure 5:
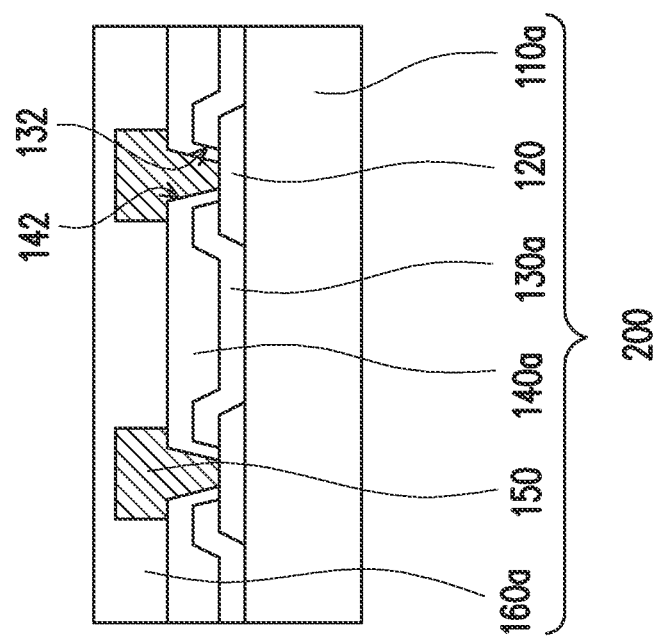
Figure 5:
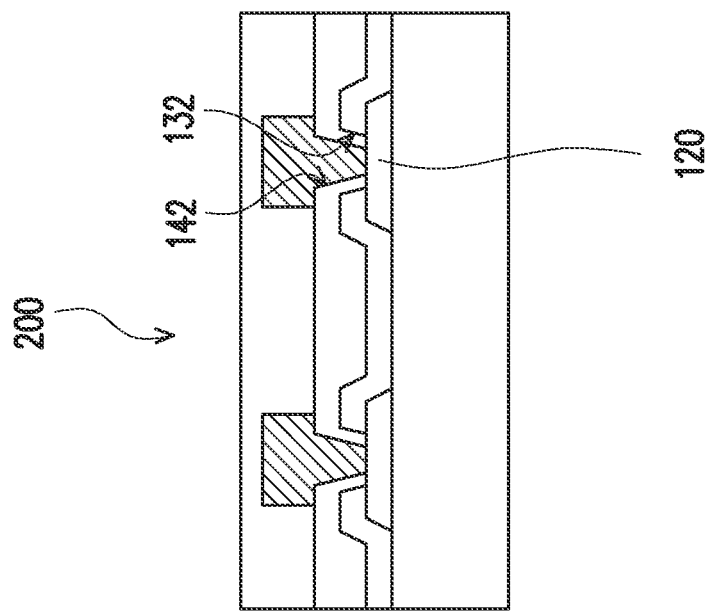

Referring to FIG. 5, after performing the back side grinding process, a wafer dicing process is performed on the thinned wafer 100' such that the integrated circuit components 200 in the wafer 100' are singulated from one another. Each of the singulated integrated circuit components 200 includes a semiconductor substrate 110a, the conductive pads 120 formed on the semiconductor substrate 110a, a passivation layer 130a, a post passivation layer 140a, the conductive pillars 150, and a protection layer 160a. As shown in FIG. 4 and FIG. 5, the materials and the characteristics of the semiconductor substrate 110a, the passivation layer 130a, the post passivation layer 140a, and the protection layer 160a are the same as those of the semiconductor substrate 100, the passivation layer 130, the post passivation layer 140, and the protection layer 160. Thus, the detailed descriptions of the semiconductor substrate 110a, the passivation layer 130a, the post passivation layer 140a, and the protection layer 160a are omitted.

As shown in FIG. 4 and FIG. 5, during the back side grinding and the wafer dicing processes, the protection layer 160 and 160a may protect the conductive pillars 150 of the integrated circuit components 200. In addition, the conductive pillars 150 of the integrated circuit components 200 may be protected from being damaged by sequentially performed processes, such as pick-up and placing process of the integrated circuit components 200, molding process, and so on.

Figure 6:
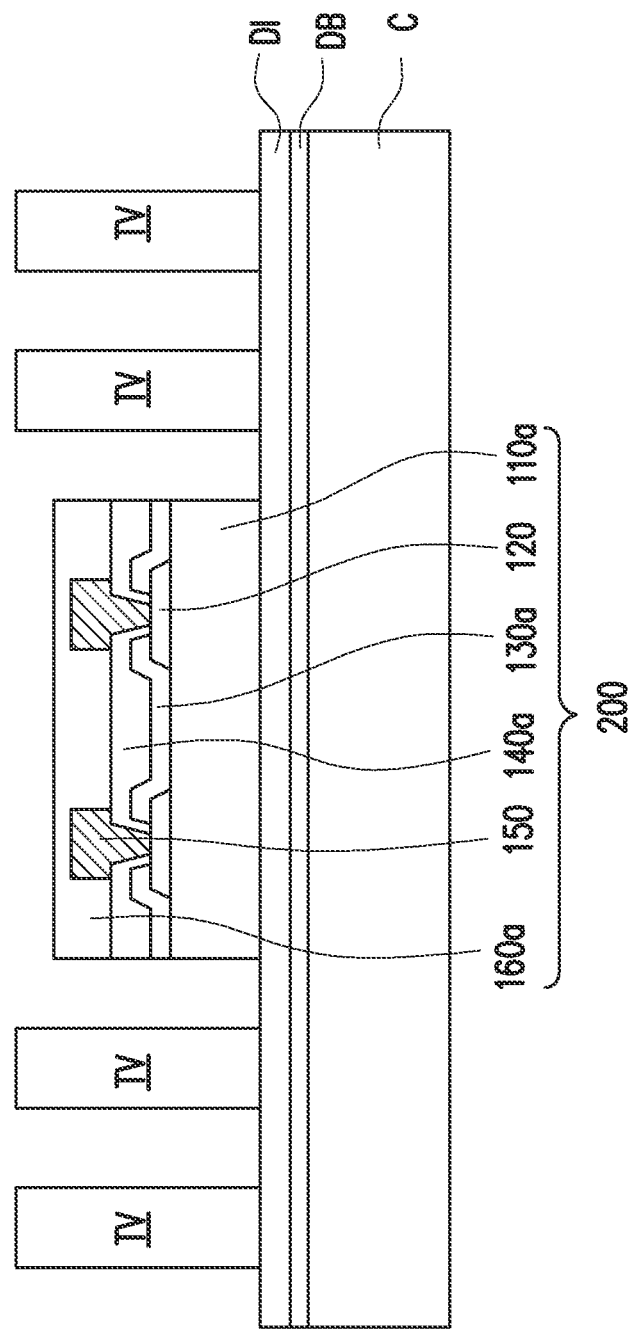

Referring to FIG. 6, after the integrated circuit components 200 are singulated from the thinned wafer 100' (shown in FIG. 4), a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example.

After the carrier C having the de-bonding layer DB and the dielectric layer DI formed thereon is provided, a plurality of conductive through vias TV are formed on the dielectric layer DI. In some embodiments, the plurality of conductive through vias TV is formed by photoresist coating, photolithography, plating, and photoresist stripping process. For example, the conductive through vias TV include copper posts or other suitable metal post.

As shown in FIG. 6, in some embodiments, one of the integrated circuit components 200 including the conductive pads 120, the conductive pillars 150, and a protection layer 160a formed thereon is picked and placed on the dielectric layer DI. The integrated circuit components 200 is attached or adhered on the dielectric layer DI through a die attach film (DAF), an adhesion paste or the like. In some alternative embodiments, more than one of the integrated circuit components 200 are picked and placed on the dielectric layer DI, wherein the integrated circuit components 200 placed on the dielectric layer DI may be arranged in an array. When the integrated circuit components 200 placed on the dielectric layer DI are arranged in an array, the conductive through vias TV may be classified into groups. The number of the integrated circuit components 200 is corresponding to the number of the groups of the conductive through vias TV.

As shown in FIG. 6, the top surface of the protection layer 160a is lower than the top surfaces of the conductive through vias TV, and the top surface of the protection layer 160a is higher than the top surfaces of the conductive pillars 150, for example. However, the disclosure is not limited thereto. In some alternative embodiments, the top surface of the protection layer 160a may be substantially aligned with the top surfaces of the conductive through vias TV, and the top surface of the protection layer 160a is higher than the top surfaces of the conductive pillars 150.

As shown in FIG. 6, the integrated circuit component 200 is picked and placed on the dielectric layer DI after the formation of the conductive through vias TV. However, the disclosure is not limited thereto. In some alternative embodiments, the integrated circuit component 200 is picked and placed on the dielectric layer DI before the formation of the conductive through vias TV.

Figure 7:
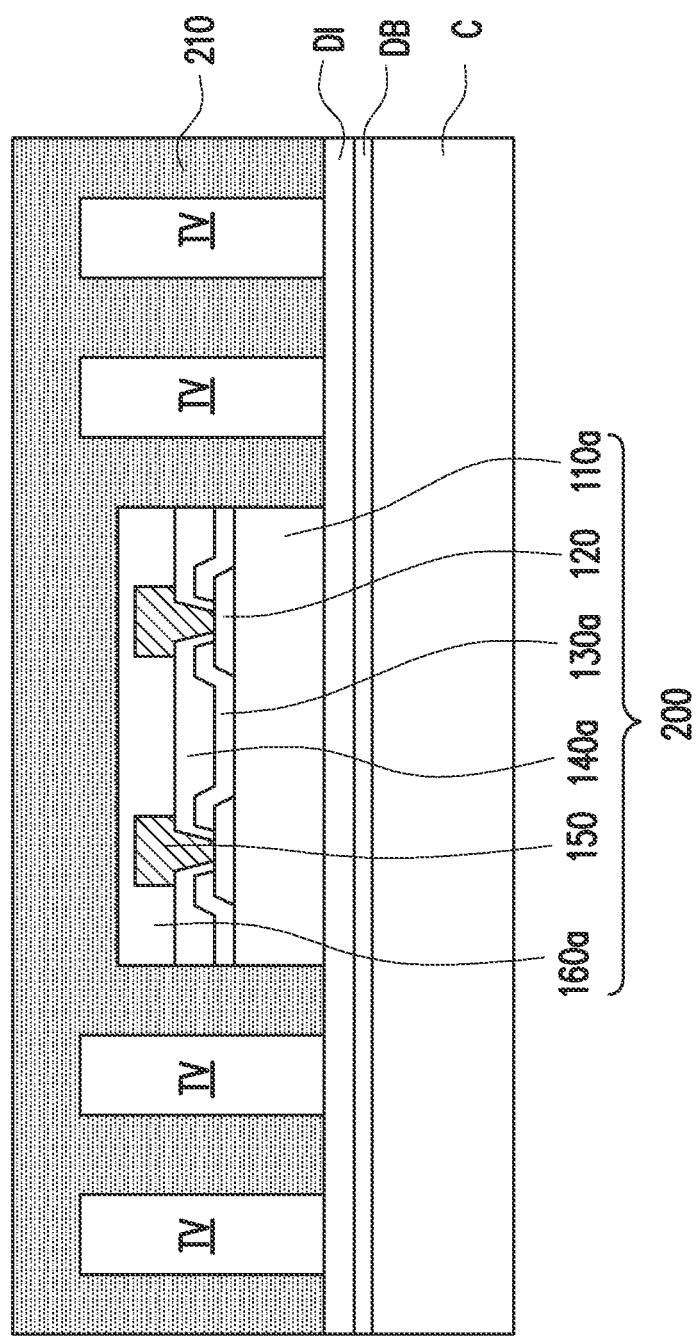

Referring to FIG. 7, an insulating material 210 is formed on the dielectric layer DI to cover the integrated circuit component 200 and the conductive through vias TV. In some embodiments, the insulating material 210 is a molding compound formed by a molding process. The conductive pillars 150 and the protection layer 160a of the integrated circuit component 200 are covered by the insulating material 210. In other words, the conductive pillars 150 and the protection layer 160a of the integrated circuit component 200 are not revealed and are well protected by the insulating material 210. In some embodiments, the insulating material 210 includes epoxy or other suitable dielectric materials.

Figure 8:
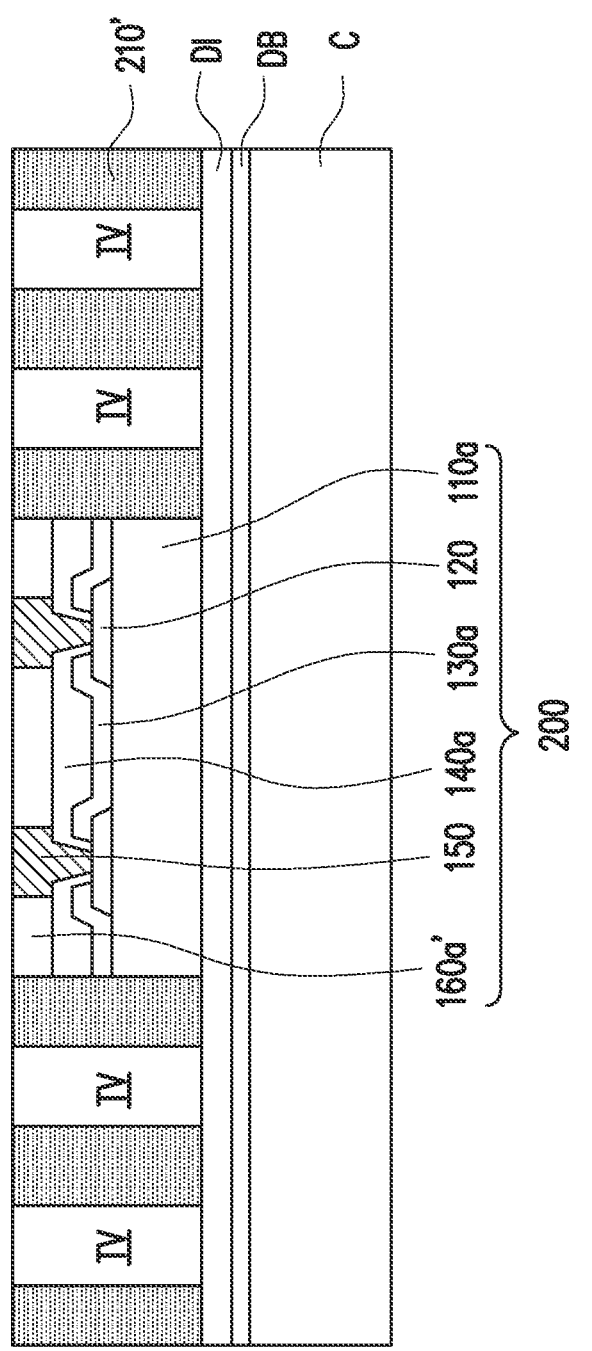

Referring to FIG. 8, the insulating material 210 is then ground until the top surfaces of the conductive pillars 150, the top surfaces of the conductive through vias TV, and the top surface of the protection layer 160a are exposed. In some embodiments, the insulating material 210 is ground by a mechanical grinding process and/or a chemical mechanical polishing (CMP) process, thereby forming an insulating encapsulation 210' over the dielectric layer DI as illustrated in FIG. 8. During the grinding process of the insulating material 210, portions of the protection layer 160a are ground to form a protection layer 160a'. In some embodiments, during the grinding process of the insulating material 210 and the protection layer 160a, portions of the conductive through vias TV and portions of the conductive pillars 150 are ground also.

As shown in FIG. 8, the insulating encapsulation 210' encapsulates the sidewalls of the integrated circuit component 200, and the insulating encapsulation 210' is penetrated by the conductive through vias TV. In other words, the integrated circuit component 200 and the conductive through vias TV are embedded in the insulating encapsulation 210'. It is noted that the top surfaces of the conductive through vias TV, the top surface of the insulating encapsulation 210', and the top surfaces of the conductive pillars 150 are substantially coplanar with the top surface of the protection layer 160a'.

After forming the insulating encapsulation 210' and the protection layer 160a', a redistribution circuit structure electrically connected to the conductive pillars 150 of the integrated circuit component 200 is then formed on the top surfaces of the conductive through vias TV, the top surface of the insulating encapsulation 210', the top surfaces of the conductive pillars 150, and the top surface of the protection layer 160a'. The redistribution circuit structure is fabricated to electrically connect with one or more connectors underneath. Here, the afore-said connectors may be the conductive pillars 150 of the integrated circuit component 200 and/or the conductive through vias TV embedded in the insulating encapsulation 210'. The fabrication processes of the redistribution circuit structure is described in accompany with FIGS. 9 through 21 in detail.

Figure 9:
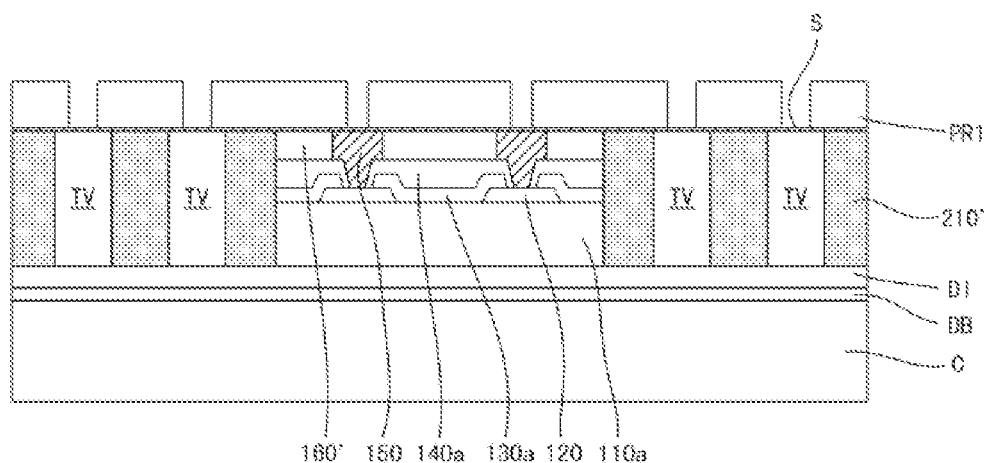

Referring to FIG. 9, a bottom seed layer S is formed on the top surfaces of the conductive through vias TV, the top surface of the insulating encapsulation 210', the top surfaces of the conductive pillars 150, and the top surface of the protection layer 160a'. In some embodiments, the bottom seed layer S may be a sputtered Ti/Cu layer and the thickness of the bottom seed layer S may be about 5 angstroms. A patterned photoresist layer PR1 is then formed over the bottom seed layer S through a photolithography process. The patterned photoresist layer PR1 includes a plurality of openings for exposing portions of the bottom seed layer S that are corresponding to the conductive pillars 150 and the conductive through vias TV.

Figure 10:
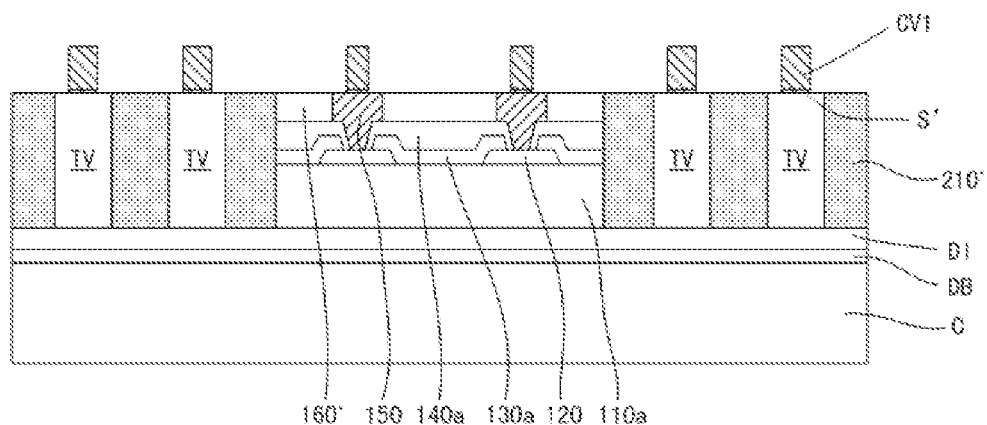

Referring to FIG. 9 and FIG. 10, a plating process is performed on the exposed portions of the bottom seed layer S such that a plurality of first conductive vias CV1 are formed in the openings defined in the patterned photoresist layer PR1. In some embodiments, the first conductive vias CV1 may be copper vias, the height (H) of the first conductive vias CV1 may range from about 3 micrometers to about 5 micrometers, and the diameter of the first conductive vias CV1 may range from about 1 micrometer to about 5 micrometers. In some embodiments, the patterned photoresist layer PR1 is formed through photoresist coating and photolithography processes providing in a dimension of the openings defined in the patterned photoresist layer PR1 ranging from about 3 micrometers to about 4 micrometers. For example, the first conductive vias CV1 are bottom-up plated copper vias selectively or exclusively formed on the exposed portions of the bottom seed layer S. Therefore, CMP process is not required after the bottom-up copper vias CV1 are plated in the openings defined in the patterned photoresist layer PR1.

After the first conductive vias CV1 are formed, the patterned photoresist layer PR1 is removed. Thereafter, by using the first conductive vias CV1 as a hard mask, portions of the bottom seed layer S that are not covered by the first conductive vias CV1 may be removed such that patterned bottom seed layers S' covered by the first conductive vias CV1 are formed on the conductive pillars 150 and the conductive through vias TV. In some embodiments, the bottom seed layer S (shown in FIG. 9) may be patterned through an etch process so as to form the patterned bottom seed layers S' (shown in FIG. 10).

Figure 11:
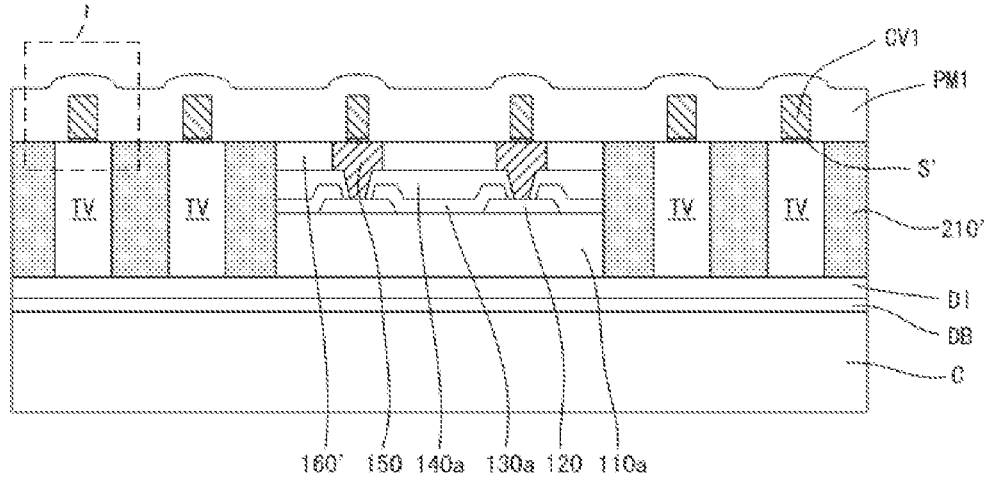
Figure 22A:
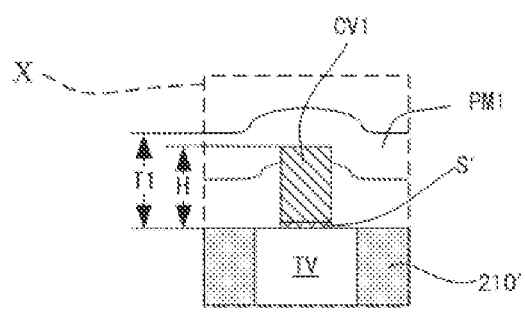
FIGS. 22A through 22D are enlarged views of region X illustrated in FIG. 11 through FIG. 14 in accordance with some embodiments of the present disclosure.

Referring to FIG. 11 and FIG. 22A, a photosensitive dielectric layer PM1 is formed to cover the first conductive vias CV1 and the patterned bottom seed layers S'. In some embodiments, the height H of the first conductive vias CV1 may range from about 3 micrometers to about 5 micrometers, and the diameter of the first conductive vias CV1 may range from about 1 micrometer to about 5 micrometers. In some embodiments, the material of the photosensitive dielectric layer PM1 may include positive photoresist material such as photosensitive polyimide or the like. The thickness T1 of the photosensitive dielectric layer PM1 ranges from about 3.1 micrometers to about 5.5 micrometers, for example. Portions of the photosensitive dielectric layer PM1 which cover the top surfaces of the first conductive vias CV1 may have thickness ranging from about 0.1 micrometer to about 0.5 micrometer. As shown in FIG. 11 and FIG. 22A, the photosensitive dielectric layer PM1 is formed to cover the first conductive vias CV1 and the patterned bottom seed layers S', and the photosensitive dielectric layer PM1 has an undulating top surface.

Figure 12:
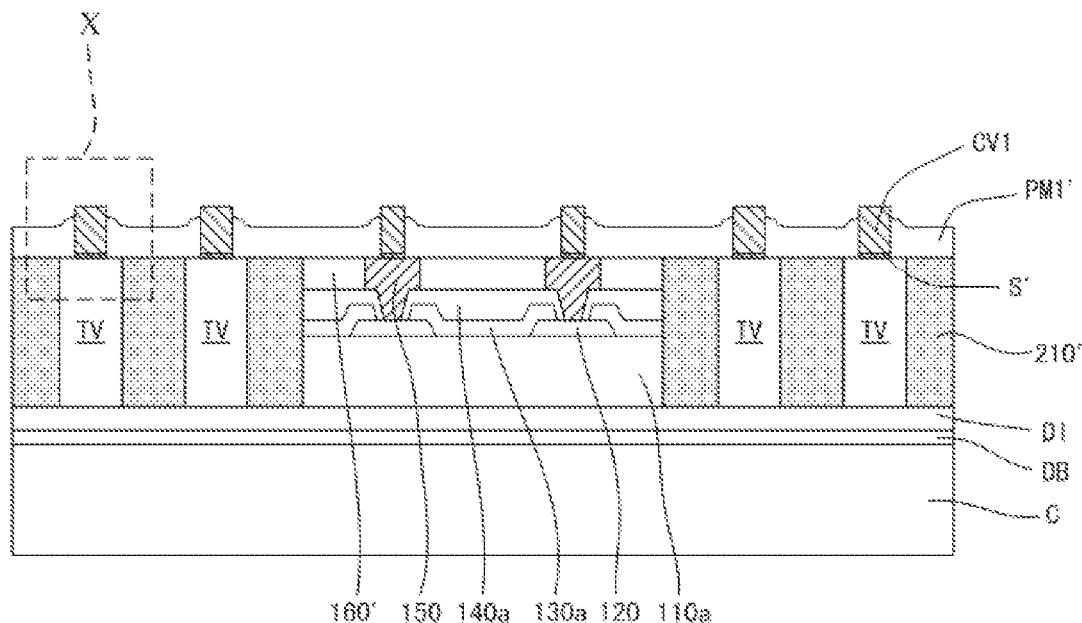
Figure 22B:
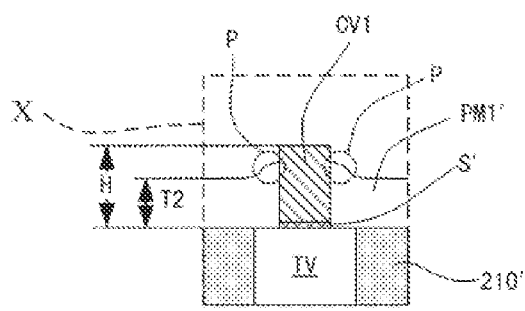

Referring to FIG. 12 and FIG. 22B, a first thinning process is performed to partially remove and thin down the photosensitive dielectric layer PM1 such that a thinned photosensitive dielectric layer PM1' with a reduced thickness T2 is formed. In addition, the first thinning process may include at least one exposure and development process. Furthermore, after performing the first thinning process, portions of the photosensitive dielectric layer PM1 (shown in FIG. 11) are removed and the first conductive vias CV1 are revealed.

As shown in FIG. 22A and FIG. 22B, during the exposure and development process (e.g., the first thinning process), an upper portion of the photosensitive dielectric layer PM1 is irradiated by a light source (e.g., an UV light source) and a lower portion of the photosensitive dielectric layer PM1 is not irradiated by the light source. Then, the photosensitive dielectric layer PM1 is developed such that the upper portion of the photosensitive dielectric layer PM1 is removed and a thinned photosensitive dielectric layer PM1' (e.g., the remaining lower portion of the photosensitive dielectric layer PM1) is formed. The reduction in thickness of the photosensitive dielectric layer PM1 may be controlled by exposure dose and development time. In some embodiments, the exposure focus window (e.g., depth of focus) may be substantially equal to or greater than about 24 micrometers. For example, the exposure focus window may range from about −12 micrometers to about +12 micrometers.

After performing the first thinning process (e.g., UV exposure process), the top surfaces of the first conductive vias CV1 may be revealed and the sidewalls of the first conductive vias CV1 are partially revealed. In some embodiments, during the first thinning process, the upper portion of the photosensitive dielectric layer PM1 may be exposed to the light source (e.g., an UV light source) and the exposure dose may range from about 200 milli-Joules (mJ) to about 300 mJ. Since the exposure dose provided to the upper portion of the photosensitive dielectric layer PM1 may range from about 200 mJ to about 300 mJ, the thinned photosensitive dielectric layer PM1' may have an undulating top surface and the thickness T2 of the thinned photosensitive dielectric layer PM1' may range from about 2 micrometers to about 5 micrometers, for example.

As shown in FIG. 12 and FIG. 22B, after performing the first thinning process, the thinned photosensitive dielectric layer PM1' may include a plurality of protruding portions P in contact with the sidewalls of the first conductive vias CV1. Furthermore, each of the protruding portions P may surround one of the first conductive vias CV1, respectively. In some embodiments, the height of the protruding portions P may range from about 0.1 micrometer to about 2 micrometers.

Figure 13:
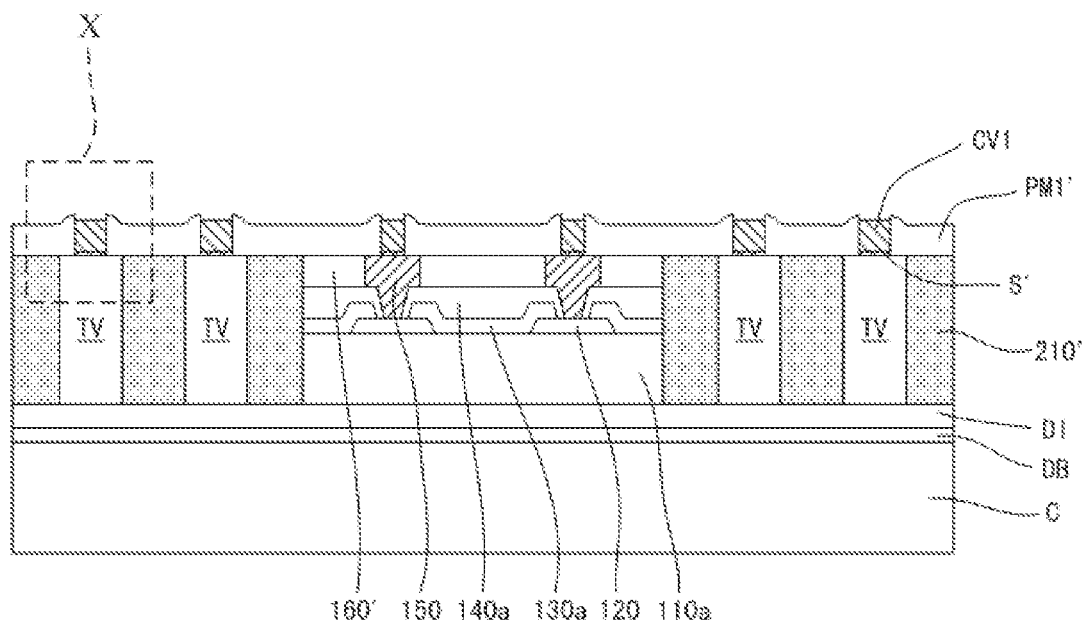
Figure 22C:
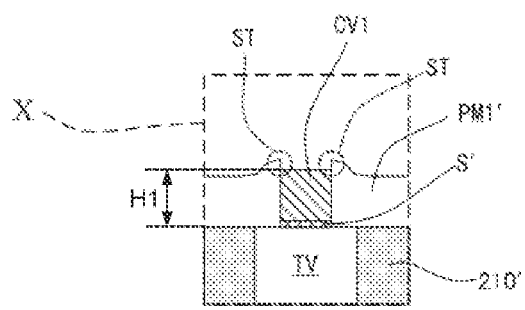

Referring to FIG. 13 and FIG. 22C, after performing the first thinning process, the conductive vias CV1 are partially removed and thinned down such that a plurality of steps ST (e.g., a level height offset) are generated between top surfaces of the conductive vias CV1 and the thinned photosensitive dielectric layer PM1'. In some embodiments, the difference between the height H of the first conductive vias CV1 illustrated in FIG. 22A and the height H1 of the first conductive vias CV1 illustrated in FIG. 22C may from about 0.1 micrometers to about 2 micrometers. In some embodiments, the height difference between the first conductive vias CV1 and the steps ST may range from about 0.1 micrometers to about 1.5 micrometers. The conductive vias CV1 are partially removed by an etch process, for example. In some embodiments, the conductive vias CV1 may be thinned down until the top surfaces of the conductive vias CV1 are lower than the topmost end of the protruding portions P. Accordingly, the steps ST are generated between top surfaces of the conductive vias CV1 and the protruding portions P of the thinned photosensitive dielectric layer PM1'.

Referring to FIG. 13, FIG. 14, FIG. 22C and FIG. 22D, the thinned photosensitive dielectric layer PM1' is partially removed to reduce the overall thickness of the thinned photosensitive dielectric layer PM1' such that the thinned photosensitive dielectric layer PM1' is thinned down and the steps ST between the top surfaces of the conductive vias CV1 and the protruding portions P of the thinned photosensitive dielectric layer PM1' are minimized or reduced. The steps ST between the top surfaces of the conductive vias CV1 and the protruding portions P are minimized or reduced by an ash process, for example. In some embodiments, the ash process is performed by a plasma treatment (e.g., $CF_4/O_2/Ar$ plasma) performed at the temperature ranging from about 25 Celsius degrees to about 150 Celsius degrees for a duration from about 30 seconds to about 600 seconds. Since the removal rate of the protruding portions P is greater than that of other portions of the thinned photosensitive dielectric layer PM1' during the dielectric ash process, the protruding portions P are flattened. In some embodiments, the thinned photosensitive dielectric layer PM1' is partially removed to form a photosensitive dielectric layer PM1", wherein the top surface of the photosensitive dielectric layer PM1" is slightly lower than the top surfaces of the conductive vias CV1.

Figure 22D:
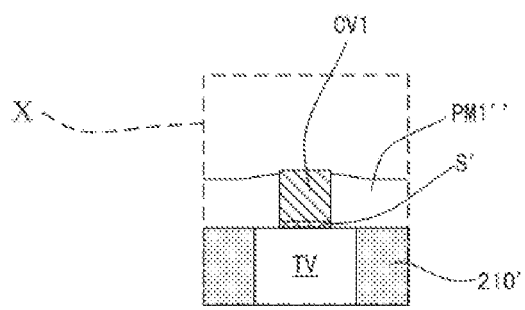

After performing the first thinning process (shown in FIG. 22B), the via etch process (shown in FIG. 22C) and the dielectric ash process (shown in FIG. 22D), the conductive vias CV1 are embedded in the photosensitive dielectric layer PM1". Compared to a CMP process, the conductive vias CV1 and the photosensitive dielectric layer PM1" fabricated by the processes illustrated in FIGS. 22C through 22D are cost effective and may enhance the productivity.

Figure 15:
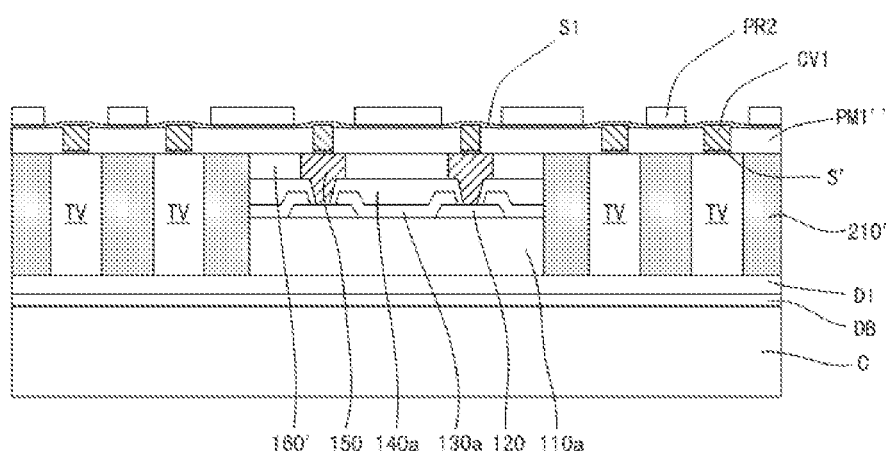

Referring to FIG. 15, a first seed layer S1 is formed to cover the first conductive vias CV1 and the photosensitive dielectric layer PM1". In some embodiments, the first seed layer S1 may be a sputtered Ti/Cu layer and the thickness of the first seed layer S1 may be about 5 angstroms. A patterned photoresist layer PR2 is then formed over the first seed layer S1 through a photolithography process. Furthermore, the patterned photoresist layer PR2 includes a plurality of openings for exposing portions of the first seed layer S1 that are corresponding to the first conductive vias CV1.

Figure 14:
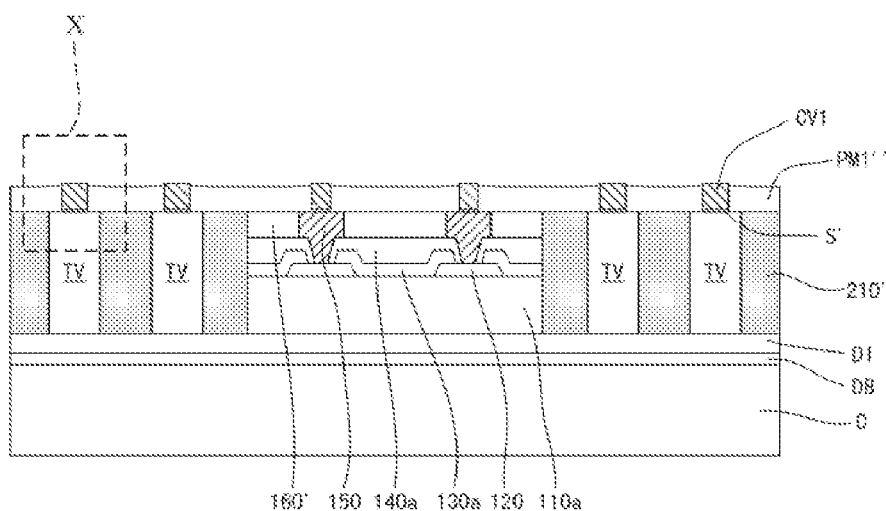
Figure 16:
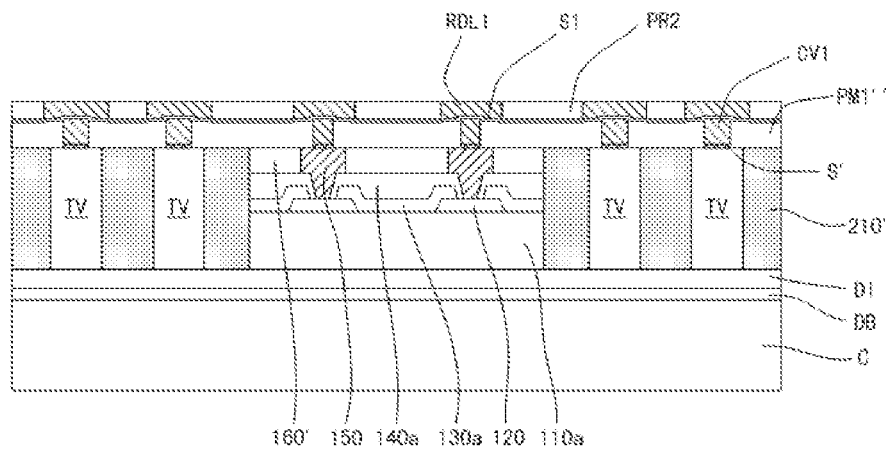

Referring to FIG. 16, a plating process, for example, is performed such that a plurality of first redistribution wirings RDL1 are formed in the openings defined in the patterned photoresist layer PR2. The first redistribution wirings RDL1 are formed on portions of the first seed layer S1 exposed by the openings of the patterned photoresist layer PR2. In some embodiments, the first redistribution wirings RDL1 may be copper wirings. However, the material of the first redistribution wirings RDL1 is not limited in the present invention. It is noted that the profile of the conductive vias CV1 and the photosensitive dielectric layer PM1" shown in FIG. 14 is merely for illustration. The profile of the conductive vias CV1 and the photosensitive dielectric layer PM1" may be modified. For example, the first redistribution wirings RDL1 may be formed over the conductive vias CV1 and the photosensitive dielectric layer PM1" illustrated in FIGS. 22D, 23D, 24B, 26C and 29C. As another example, the first redistribution wirings RDL1 may be formed over the conductive vias CV1 and the photosensitive dielectric layer PM1''' illustrated in FIGS. 25D, 27D, 28D and 30D. As yet another example, the first redistribution wirings RDL1 may be formed over the conductive vias CV1 and the photosensitive dielectric layer PM1' illustrated in FIG. 24B.

Figure 17:
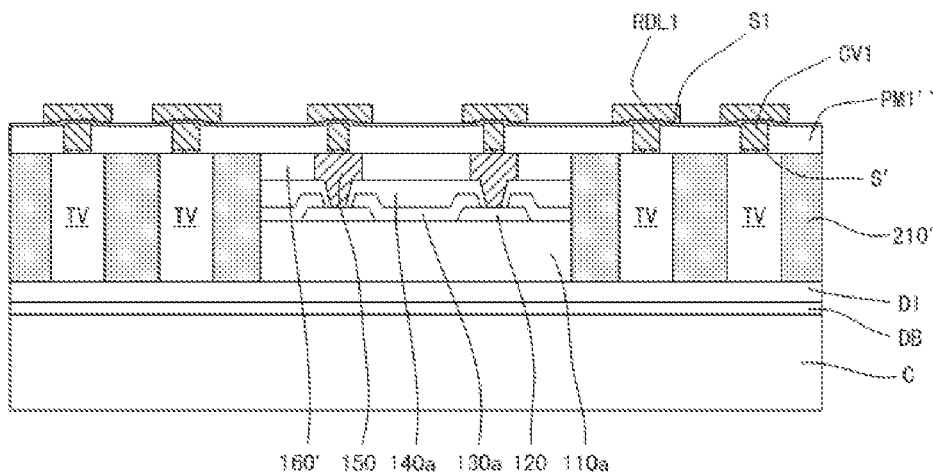
Figure 18:
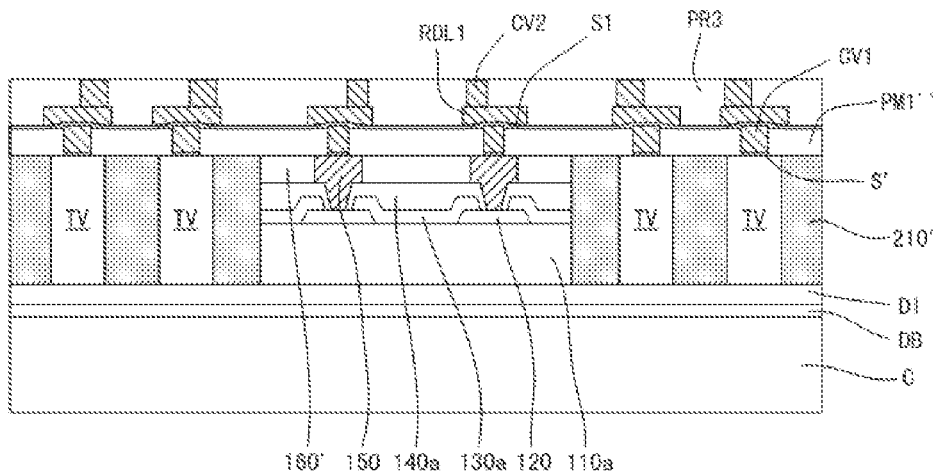

Referring to FIG. 17 and FIG. 18, after forming the first redistribution wirings RDL1, the patterned photoresist layer PR2 is removed so as to expose the first seed layer S1. After removing the patterned photoresist layer PR2, a patterned photoresist layer PR3 is formed to partially cover the first redistribution wirings RDL1. The patterned photoresist layer PR3 includes a plurality of openings for exposing portions of the first redistribution wirings RDL1, for example. A plating process, for example, is then performed such that a plurality of second conductive vias CV2 are formed on the first redistribution wirings RDL1 and formed in the openings defined in the patterned photoresist layer PR3. The second conductive vias CV2 are directly in contact with the first redistribution wirings RDL1. As shown in FIG. 18, there is no seed layer between the second conductive vias CV2 and the first redistribution wirings RDL1. In some embodiments, the second conductive vias CV2 may be copper vias, the height (H) of the second conductive vias CV2 may range from about 3 micrometers to about 5 micrometers, and the diameter of the second conductive vias CV2 may range from about 0.5 micrometer to about 5 micrometers.

Figure 19:
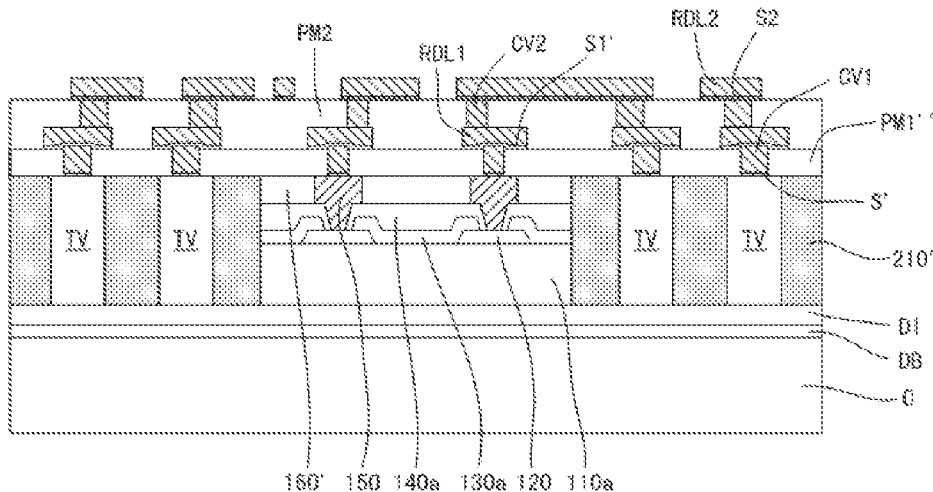

Referring to FIG. 18 and FIG. 19, after forming the second conductive vias CV2, the patterned photoresist layer PR3 is removed. Thereafter, by using the first redistribution wirings RDL1 as a hard mask, portions of the first seed layer S1 that are not covered by the first redistribution wirings RDL1 may be removed (e.g., etched) to form a plurality of first patterned seed layers S1'. The first patterned seed layers S1' are covered by the first redistribution wirings RDL1 and are disposed on the first conductive vias CV1 and the photosensitive dielectric layer PM1".

A photosensitive dielectric layer PM2 is then formed to cover the first patterned seed layer S1', the first redistribution wirings RDL1 and the second conductive vias CV2. In other words, the first patterned seed layer S1', the first redistribution wirings RDL1 and the second conductive vias CV2 are embedded in the photosensitive dielectric layer PM2. In some embodiments, the material of the photosensitive dielectric layer PM2 may include positive photoresist material such as photosensitive polyimide or the like. In some embodiments, the fabrication processes of the photosensitive dielectric layer PM2 may be similar with the fabrication processes of the photosensitive dielectric layer PM1/PM1'/PM1" as illustrated in FIGS. 11 through 14. However, the fabrication processes of the photosensitive dielectric layer PM2 are not limited thereto.

After forming the photosensitive dielectric layer PM2, a plurality of second patterned seed layers S2 (e.g., sputtered Ti/Cu patterns) and a plurality of second redistribution wirings RDL2 are formed on the second conductive vias CV2 and the photosensitive dielectric layer PM2. In some embodiments, the fabrication processes of the second redistribution wirings RDL2 may be similar with the fabrication processes of the first redistribution wirings RDL1 as illustrated in FIGS. 15 through 18. However, the fabrication processes of the second redistribution wirings RDL2 are not limited thereto.

Figure 20:
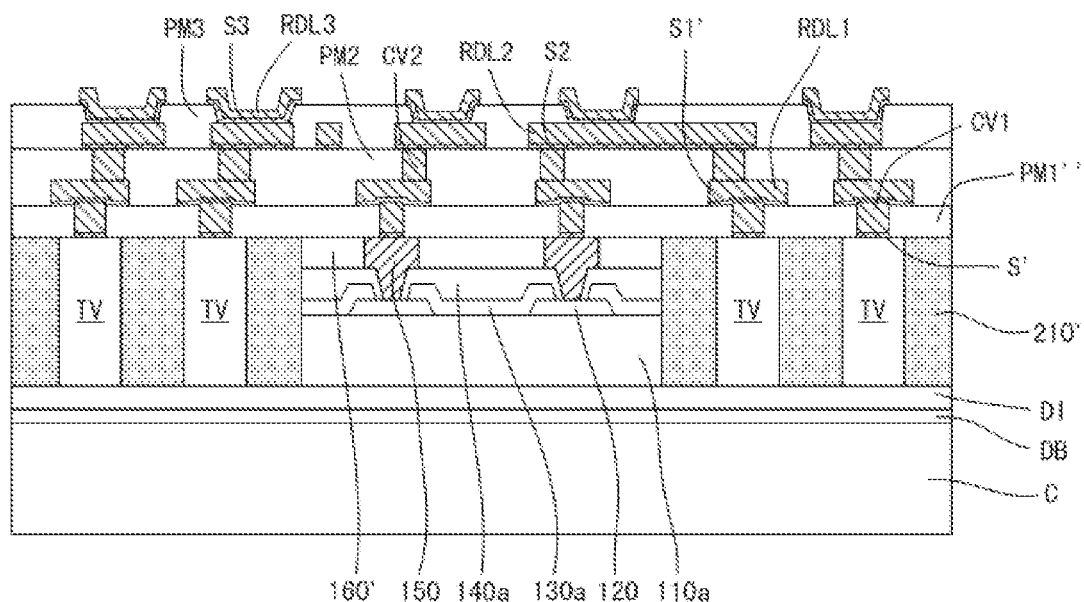

Referring to FIG. 20, a patterned dielectric layer PM3 having a plurality of via openings is formed on the photosensitive dielectric layer PM2 so as to cover portions of the second redistribution wirings RDL2. In some embodiments, the patterned dielectric layer PM3 may be a photosensitive dielectric layer and the photosensitive dielectric layer may be patterned directly by a photolithography process. For example, the material of the photosensitive dielectric layer PM3 may include positive photoresist material such as photosensitive polyimide or the like. In some alternative embodiments, the patterned dielectric layer PM3 may be a non-photosensitive dielectric layer and the non-photosensitive dielectric layer may be patterned by photoresist coating, photolithography and etch processes. For example, the patterned dielectric layer PM3 may be a polyimide (PI) layer, a polybenzoxazole (PBO) layer or other suitable dielectric polymers.

After forming the patterned dielectric layer PM3, a plurality of third patterned seed layers S3 (e.g., sputtered Ti/Cu patterns) and a plurality of third redistribution wirings RDL3 are formed in the via openings of the photosensitive dielectric layer PM3. In other words, the third patterned seed layers S3 and the third redistribution wirings RDL3 are electrically connected to the second redistribution wirings RDL2 through the via openings of the photosensitive dielectric layer PM3. In some embodiments, the third patterned seed layers S3 and the third redistribution wirings RDL3 may be formed by following processes. First, a seed layer (not shown) is conformally formed on the patterned dielectric layer PM3 and portions of the second redistribution wirings RDL2 exposed by the via openings of the patterned dielectric layer PM3. Then, a patterned photoresist layer (not shown) is formed on the seed layer, wherein the patterned photoresist layer includes a plurality of openings for exposing portions of the seed layer. Thereafter, a plurality of third redistribution wirings RDL3 are formed (e.g., plated) in the openings of the patterned photoresist layer. The third redistribution wirings RDL3 are formed on the portions of the seed layer exposed by the openings of the patterned photoresist layer. After forming the third redistribution wirings RDL3, the patterned photoresist layer is removed. Thereafter, by using the third redistribution wirings RDL3 as a hard mask, portions of the seed layer that are not covered by the third redistribution wirings RDL3 may be removed (e.g., etched) such that the third patterned seed layers S3 covered by the third redistribution wirings RDL3 is formed on the second redistribution wirings RDL2 and the patterned dielectric layer PM3, as shown in FIG. 20.

It is noted that, the second patterned seed layers S2 and the second redistribution wirings RDL2 are formed before forming the patterned dielectric layer PM3 while the third patterned seed layers S3 and the third redistribution wirings RDL3 are formed after forming the patterned dielectric layer PM3. The fabrication processes of the patterned dielectric layer PM3 may be different from the fabrication processes of the photosensitive dielectric layers PM1" and PM2, for example.

Figure 21:
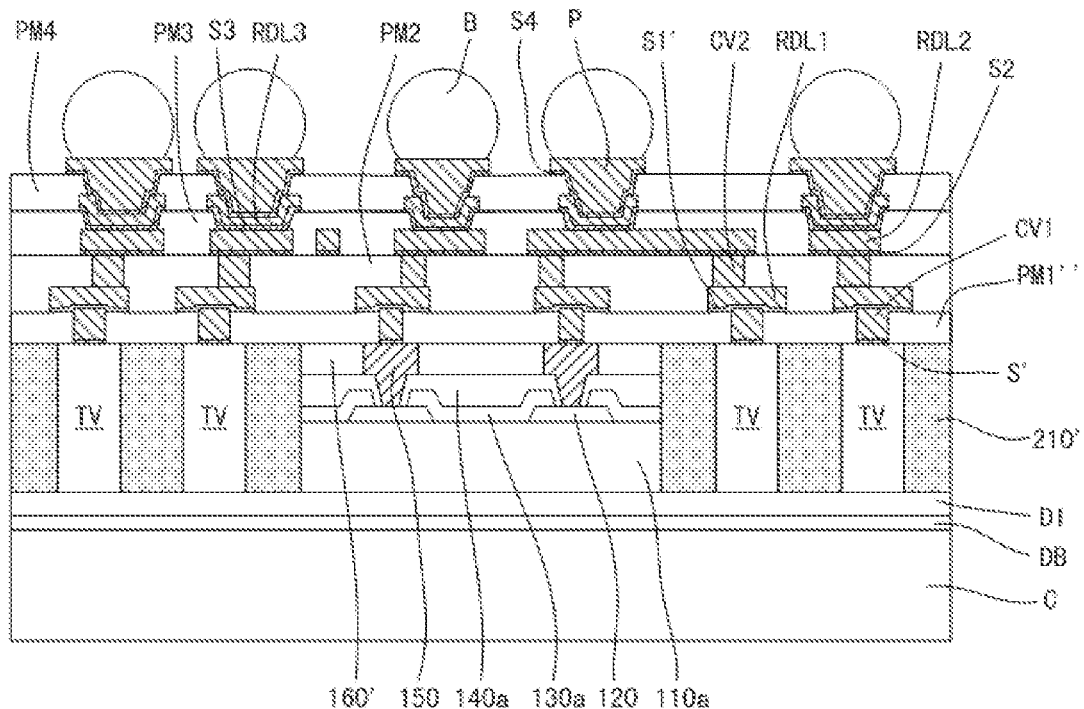

Referring to FIG. 21, a patterned dielectric layer PM4, a patterned seed layer S4 (e.g., a sputtered Ti/Cu layer) and pads P are formed on the third redistribution wirings RDL3 and the patterned dielectric layer PM3. In some embodiments, the patterned dielectric layer PM4 may be a photosensitive dielectric layer and the photosensitive dielectric layer may be patterned directly by a photolithography process. For example, the material of the photosensitive dielectric layer PM4 may include positive photoresist material such as photosensitive polyimide or the like. In some alternative embodiments, the patterned dielectric layer PM4 may be a non-photosensitive dielectric layer and the non-photosensitive dielectric layer may be patterned by photoresist coating, photolithography and etch processes. For example, the patterned dielectric layer PM4 may be a polyimide (PI) layer, a polybenzoxazole (PBO) layer or other suitable dielectric polymers. The fabricating processes of the patterned dielectric layer PM4 is similar with the fabricating processes of the patterned dielectric layer PM3. The fabricating processes of the fourth patterned seed layer S4 and the pads P are similar with the fabricating processes of the third patterned seed layers S3 and the third redistribution wirings RDL3 as illustrated in FIG. 20.

As shown in FIG. 21, the patterned dielectric layer PM4 includes a plurality of via openings formed therein. Furthermore, the pads P are formed on the patterned dielectric layer PM4 and are electrically connected to the third redistribution wirings RDL3 through the via openings in the fourth dielectric layer PM4. In some embodiments, the pads P may include a plurality of under-ball metallurgy (UBM) patterns for ball mount and/or a plurality of connection pads for mounting of passive components.

After the redistribution circuit structure is formed, as shown in FIG. 21, a de-bonding process may be performed to de-bond the resulted structure (e.g., the integrated fan-out package) from the de-bonding layer DB carried by the carrier C. In some embodiments, the integrated fan-out package may be flipped upside down and the dielectric layer DI may be patterned to reveal the surfaces of the conductive through vias TV. Then, an additional semiconductor device (e.g., DRAM or the like) may be stacked over the integrated fan-out package and the semiconductor device may be electrically connected to the integrated fan-out package through solder bumps (e.g., C4 bumps, micro-bumps or the like) such that a package-on-package (PoP) structure is fabricated. In some alternative embodiments, the formation and patterning processes of the dielectric layer DI may be omitted.

FIGS. 23A through 23D are enlarged views of region X illustrated in FIG. 11 through FIG. 14 in accordance with some embodiments of the present disclosure.

Figure 23A:
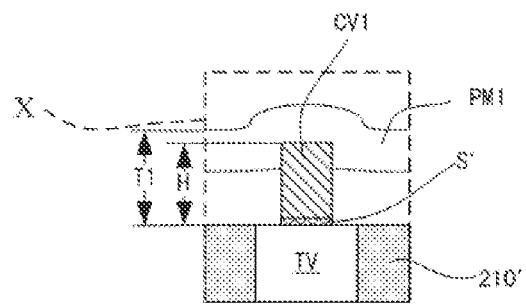
FIGS. 23A through 23D are enlarged views of region X illustrated in FIG. 11 through FIG. 14 in accordance with some alternative embodiments of the present disclosure.

Referring to FIG. 11 and FIG. 23A, a photosensitive dielectric layer PM1 is formed to cover the first conductive vias CV1 and the patterned bottom seed layers S'. In some embodiments, the height H of the first conductive vias CV1 may range from about 3 micrometers to about 5 micrometers, and the diameter of the first conductive vias CV1 may range from about 1 micrometer to about 5 micrometers. In some embodiments, the material of the photosensitive dielectric layer PM1 may include positive photoresist material such as photosensitive polyimide or the like. The thickness T1 of the photosensitive dielectric layer PM1 ranges from about 4 micrometers to about 10 micrometers, for example. Portions of the photosensitive dielectric layer PM1 which cover the top surfaces of the first conductive vias CV1 may have thickness ranging from about 1 micrometer to about 5 micrometers. As shown in FIG. 11 and FIG. 23A, the photosensitive dielectric layer PM1 is formed to cover the first conductive vias CV1 and the patterned bottom seed layers S', and the photosensitive dielectric layer PM1 has an undulating top surface.

Figure 23B:
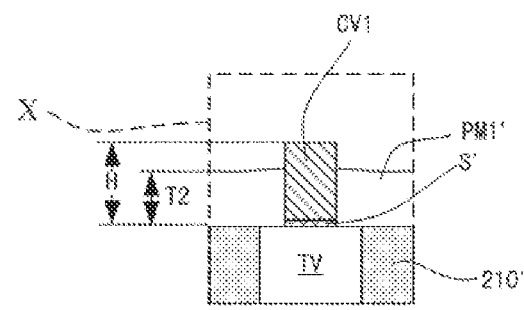

Referring to FIG. 12 and FIG. 23B, a first thinning process is performed to partially remove and thin down the photosensitive dielectric layer PM1 such that a thinned photosensitive dielectric layer PM1' with a reduced thickness T2 is formed. In addition, the first thinning process may include at least one exposure and development process. Furthermore, after performing the first thinning process, portions of the photosensitive dielectric layer PM1 (shown in FIG. 11) are removed and the first conductive vias CV1 are revealed.

As shown in FIG. 23A and FIG. 23B, during the exposure and development process (e.g., the first thinning process), an upper portion of the photosensitive dielectric layer PM1 is irradiated by a light source (e.g., an UV light source) and a lower portion of the photosensitive dielectric layer PM1 is not irradiated by the light source. Then, the photosensitive dielectric layer PM1 is developed such that the upper portion of the photosensitive dielectric layer PM1 is removed and a thinned photosensitive dielectric layer PM1' (e.g., the remaining lower portion of the photosensitive dielectric layer PM1) is formed. The reduction in thickness of the photosensitive dielectric layer PM1 may be controlled by exposure dose and development time. In some embodiments, the exposure focus window (e.g., depth of focus) may be substantially equal to or greater than about 24 micrometers. For example, the exposure focus window may range from about −12 micrometers to about +12 micrometers.

After performing the first thinning process (e.g., UV exposure process), the top surfaces of the first conductive vias CV1 may be revealed and the sidewalls of the first conductive vias CV1 are partially revealed. In some embodiments, during the first thinning process, the upper portion of the photosensitive dielectric layer PM1 may be exposed to the light source (e.g., an UV light source) and the exposure dose may range from about 400 mJ to about 900 mJ. Since the exposure dose provided to the upper portion of the photosensitive dielectric layer PM1 may range from about 400 mJ to about 900 mJ, the thinned photosensitive dielectric layer PM1' may have an undulating top surface and the thickness T2 of the thinned photosensitive dielectric layer PM1' may range from about 2 micrometers to about 5 micrometers, for example. Since the thickness (e.g., thickness T1 ranging from about 4 micrometers to about 10 micrometers) of the photosensitive dielectric layer PM1 illustrated in FIG. 23A is greater than the thickness (e.g., thickness T1 ranging from about 3.1 micrometers to about 5.5 micrometers) of the photosensitive dielectric layer PM1 illustrated in FIG. 22A, the removal amount of the dielectric material of the photosensitive dielectric layer PM1 illustrated in FIG. 23A is greater than that of the photosensitive dielectric layer PM1 illustrated in FIG. 22A when performing the first thinning process. Accordingly, as compared with the thinned photosensitive dielectric layer PM1' illustrated in FIG. 22B, the top surface of the thinned photosensitive dielectric layer PM1' illustrated in FIG. 23B is flatter.

Figure 23C:
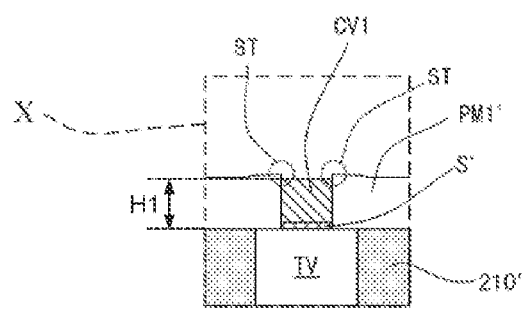

Referring to FIG. 13 and FIG. 23C, after performing the first thinning process, the conductive vias CV1 are partially removed and thinned down such that a plurality of steps ST (e.g., a level height offset) are generated between top surfaces of the conductive vias CV1 and the thinned photosensitive dielectric layer PM1'. In some embodiments, the difference between the height H of the first conductive vias CV1 illustrated in FIG. 23A and the height H1 of the first conductive vias CV1 illustrated in FIG. 23C may from about 0.1 micrometers to about 2 micrometers. In some embodiments, the height difference between the first conductive vias CV1 and the steps ST may range from about 0.1 micrometers to about 1.5 micrometers. The conductive vias CV1 are partially removed by an etch process, for example. In some embodiments, the conductive vias CV1 may be thinned down until the top surfaces of the conductive vias CV1 are lower than the top surface of the thinned photosensitive dielectric layer PM1'. Accordingly, the steps ST are generated between top surfaces of the conductive vias CV1 and portions of the thinned photosensitive dielectric layer PM1' in proximity to the conductive vias CV1.

Referring to FIG. 13, FIG. 14, FIG. 23C and FIG. 23D, the thinned photosensitive dielectric layer PM1' is partially removed to reduce the overall thickness of the thinned photosensitive dielectric layer PM1' such that the thinned photosensitive dielectric layer PM1' is thinned down and the steps ST between the top surfaces of the conductive vias CV1 and the top surface of the thinned photosensitive dielectric layer PM1' are minimized or reduced. The steps ST between the top surfaces of the conductive vias CV1 and the portions which is in proximity to the conductive vias CV1 are removed by an ash process, for example. In some embodiments, the ash process is performed by a plasma treatment (e.g., $CF_4/O_2/Ar$ plasma) performed under a temperature ranging from about 25 Celsius degrees to about 150 Celsius degrees, and for a duration from about 30 seconds to about 600 seconds. Since the removal rate of the portions in proximity to the conductive vias CV1 is greater than that of other portions of the thinned photosensitive dielectric layer PM1' during the dielectric ash process, the steps ST may be eliminated or reduced. In some embodiments, the thinned photosensitive dielectric layer PM1' is partially removed to form a photosensitive dielectric layer PM1", wherein the top surface of the photosensitive dielectric layer PM1" is substantially level with, slightly higher than or slightly lower than the top surfaces of the conductive vias CV1.

Figure 23D:
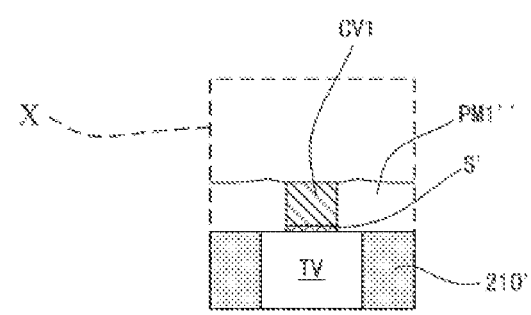

After performing the first thinning process (shown in FIG. 23B), the via etch process (shown in FIG. 23C) and the dielectric ash process (shown in FIG. 23D), the conductive vias CV1 are embedded in the photosensitive dielectric layer PM1". Compared to a CMP process, the conductive vias CV1 and the photosensitive dielectric layer PM1" fabricated by the processes illustrated in FIGS. 23C through 23D are cost effective and may enhance the productivity.

After forming the conductive vias CV1 and the photosensitive dielectric layer PM1" (shown in FIG. 23D), the processes illustrated in FIG. 15 through FIG. 21 may be performed to fabricate the redistribution circuit structure.

FIGS. 24A through 24B, FIGS. 25A through 25D, FIGS. 26A through 26C, FIGS. 27A through 27D, FIGS. 28A through 28D, FIGS. 29A through 29C, and FIGS. 30A through 30D are cross-sectional views in accordance with various embodiments of the present disclosure.

Figure 24A:
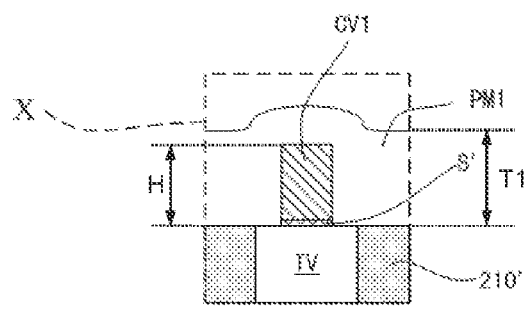
FIGS. 24A through 24B, FIGS. 25A through 25D, FIGS. 26A through 26C, FIGS. 27A through 27D, FIGS. 28A through 28D, FIGS. 29A through 29C, and FIGS. 30A through 30D are cross-sectional views in accordance with various embodiments of the present disclosure.

Referring to FIG. 24A, a photosensitive dielectric layer PM1 is formed to cover the first conductive vias CV1 and the patterned bottom seed layers S'. In some embodiments, the height H of the first conductive vias CV1 may range from about 3 micrometers to about 5 micrometers, and the diameter of the first conductive vias CV1 may range from about 1 micrometer to about 5 micrometers. In some embodiments, the material of the photosensitive dielectric layer PM1 may include positive photoresist material such as photosensitive polyimide or the like. The thickness of the photosensitive dielectric layer PM1 ranges from about 4 micrometers to about 10 micrometers, for example. Portions of the photosensitive dielectric layer PM1 which cover the top surfaces of the first conductive vias CV1 may have thickness ranging from about 1 micrometer to about 5 micrometers. As shown in FIG. 24A, the photosensitive dielectric layer PM1 is formed to cover the first conductive vias CV1 and the patterned bottom seed layers S', and the photosensitive dielectric layer PM1 has an undulating top surface.

Figure 24B:
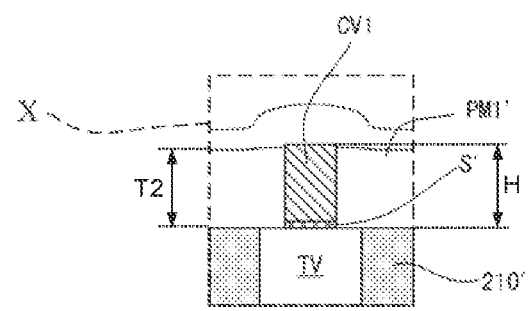

Referring to FIG. 24B, a first thinning process is performed to partially remove and thinned down the photosensitive dielectric layer PM1 such that a thinned photosensitive dielectric layer PM1' with a reduced thickness (e.g. a thickness ranging from about 3 micrometers to about 5 micrometers) is formed. In addition, the first thinning process may include at least one exposure and development process. Furthermore, after performing the first thinning process, portions of the photosensitive dielectric layer PM1 are removed and the first conductive vias CV1 are revealed.

As shown in FIG. 24A and FIG. 24B, during the exposure and development process (e.g., the first thinning process), an upper portion of the photosensitive dielectric layer PM1 is irradiated by a light source (e.g., an UV light source) and a lower portion of the photosensitive dielectric layer PM1 is not irradiated by the light source. Then, the photosensitive dielectric layer PM1 is developed such that the upper portion of the photosensitive dielectric layer PM1 is removed and a thinned photosensitive dielectric layer PM1' (e.g., the remaining lower portion of the photosensitive dielectric layer PM1) is formed. The reduction in thickness of the photosensitive dielectric layer PM1 may be controlled by exposure dose and development time. In some embodiments, the exposure focus window (e.g., depth of focus) may be substantially equal to or greater than about 24 micrometers. For example, the exposure focus window may range from about −12 micrometers to about +12 micrometers.

After performing the first thinning process (e.g., UV exposure process), the top surfaces of the first conductive vias CV1 may be revealed. In some embodiments, during the first thinning process, the upper portion of the photosensitive dielectric layer PM1 may be exposed to the light source (e.g., an UV light source) and the exposure dose may range from about 250 mJ to about 500 mJ. Since the exposure dose provided to the upper portion of the photosensitive dielectric layer PM1 ranges from about 250 mJ to about 500 mJ and provides sufficient removal amount of the dielectric material of the photosensitive dielectric layer PM1, the thickness of the thinned photosensitive dielectric layer PM1' may be controlled to be substantially equal to or slightly smaller than the height of the first conductive vias CV1, for example.

After forming the conductive vias CV1 and the photosensitive dielectric layer PM1' (shown in FIG. 24B), the processes illustrated in FIG. 15 through FIG. 21 may be performed to fabricate the redistribution circuit structure.

Figure 25A:
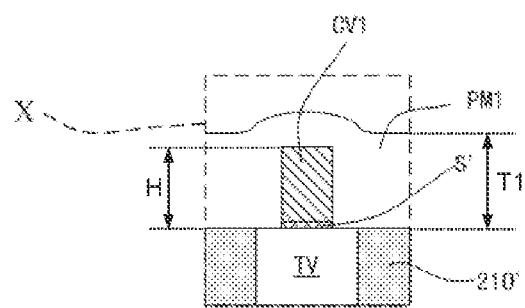

Referring to FIG. 25A, a photosensitive dielectric layer PM1 is formed to cover the first conductive vias CV1 and the patterned bottom seed layers S'. In some embodiments, the height of the first conductive vias CV1 may range from about 3 micrometers to about 5 micrometers, and the diameter of the first conductive vias CV1 may range from about 1 micrometer to about 5 micrometers. In some embodiments, the material of the photosensitive dielectric layer PM1 may include positive photoresist material such as photosensitive polyimide or the like. The thickness T1 of the photosensitive dielectric layer PM1 ranges from about 3.1 micrometers to about 5.5 micrometers, for example. Portions of the photosensitive dielectric layer PM1 which cover the top surfaces of the first conductive vias CV1 may have thickness ranging from about 0.1 micrometer to about 0.5 micrometer. As shown in FIG. 25A, the photosensitive dielectric layer PM1 is formed to cover the first conductive vias CV1 and the patterned bottom seed layers S', and the photosensitive dielectric layer PM1 has an undulating top surface.

Figure 25B:
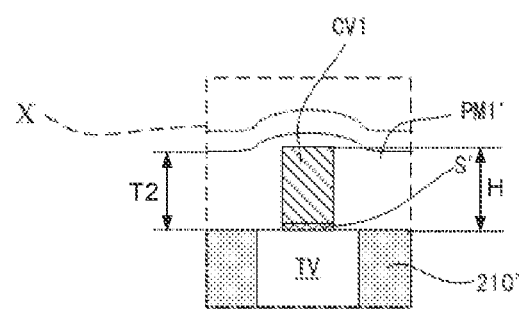

Referring to FIG. 25B, a first thinning process is performed to partially remove and thin down the photosensitive dielectric layer PM1 such that a thinned photosensitive dielectric layer PM1' with a reduced thickness T2 is formed. In addition, the first thinning process may include at least one exposure and development process.

As shown in FIG. 25A and FIG. 25B, during the exposure and development process (e.g., the first thinning process), an upper portion of the photosensitive dielectric layer PM1 is irradiated by a light source (e.g., an UV light source) and a lower portion of the photosensitive dielectric layer PM1 is not irradiated by the light source. Then, the photosensitive dielectric layer PM1 is developed such that the upper portion of the photosensitive dielectric layer PM1 is removed and a thinned photosensitive dielectric layer PM1' (e.g., the remaining lower portion of the photosensitive dielectric layer PM1) is formed. The reduction in thickness of the photosensitive dielectric layer PM1 may be controlled by exposure dose and development time. In some embodiments, the exposure focus window (e.g., depth of focus) may be substantially equal to or greater than about 24 micrometers. For example, the exposure focus window may range from about −12 micrometers to about +12 micrometers.

After performing the first thinning process (e.g., UV exposure process), the first conductive vias CV1 are covered by the thinned photosensitive dielectric layer PM1'. The thickness T2 of the thinned photosensitive dielectric layer PM1' may be thicker than or substantially equal to that of the first conductive vias CV1. In some embodiments, during the first thinning process, the upper portion of the photosensitive dielectric layer PM1 may be exposed to the light source (e.g., an UV light source) and the exposure dose may range from about 100 mJ to about 150 mJ. Since the exposure dose provided to the upper portion of the photosensitive dielectric layer PM1 may range from about 100 mJ to about 150 mJ, the thinned photosensitive dielectric layer PM1' may have an undulating top surface and the thickness T2 of the thinned photosensitive dielectric layer PM1' may range from about 3.5 micrometers to about 5.25 micrometers, for example.

Figure 25C:
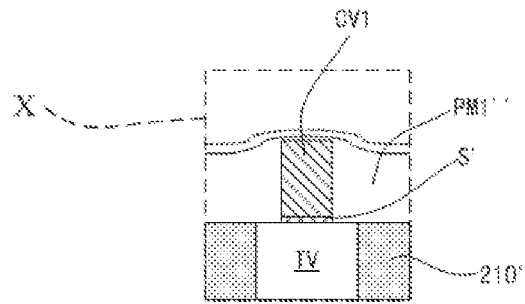
Figure 25D:
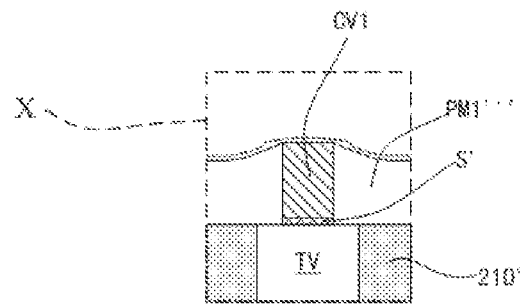

Referring to FIG. 25C and FIG. 25D, a second thinning process is performed to thin down the thinned photosensitive dielectric layer PM1' until the conductive vias CV1 are revealed. In some embodiments, the second thinning process includes a curing process followed by an ash process. As illustrated in FIG. 25C, the curing process is performed to cure the photosensitive dielectric layer PM1'. For example, the curing process is performed under a curing temperature ranging from about 150 Celsius degrees to about 250 Celsius degrees and the duration of the curing process ranges from about 0.5 hour to about 2 hours. After performing the curing process of the photosensitive dielectric layer PM1', the photosensitive dielectric layer PM1' may shrink and a cured photosensitive dielectric layer PM1" having a reduced thickness (compared to the photosensitive dielectric layer PM1') is formed. As illustrated in FIG. 25D, after forming the cured photosensitive dielectric layer PM1", the cured photosensitive dielectric layer PM1" may be partially removed by ash process to form a photosensitive dielectric layer PM1''', wherein the conductive vias CV1 are revealed by the photosensitive dielectric layer PM1'''. In some embodiments, the ash process is performed by a plasma treatment (e.g., $CF_4/O_2/Ar$ plasma), the ash process is performed under the temperature ranging from about 25 Celsius degrees to about 150 Celsius degrees, and the duration of the ash process ranges from about 30 seconds to about 600 seconds.

After forming the conductive vias CV1 and the photosensitive dielectric layer PM1''' (shown in FIG. 25D), the processes illustrated in FIG. 15 through FIG. 21 may be performed to fabricate the redistribution circuit structure.

Figure 26A:
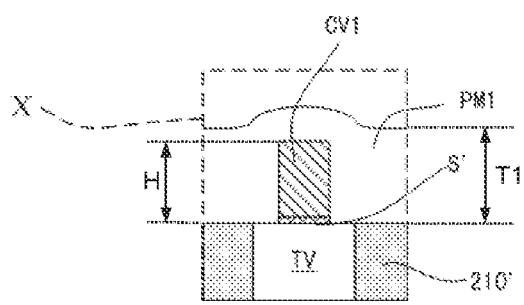

Referring to FIG. 26A, a photosensitive dielectric layer PM1 is formed to cover the first conductive vias CV1 and the patterned bottom seed layers S'. In some embodiments, the height of the first conductive vias CV1 may range from about 3 micrometers to about 5 micrometers, and the diameter of the first conductive vias CV1 may range from about 1 micrometer to about 5 micrometers. In some embodiments, the material of the photosensitive dielectric layer PM1 may include positive photoresist material such as photosensitive polyimide or the like. The thickness T1 of the photosensitive dielectric layer PM1 ranges from about 3.1 micrometers to about 5.5 micrometers, for example. Portions of the photosensitive dielectric layer PM1 which cover the top surfaces of the first conductive vias CV1 may have thickness ranging from about 0.1 micrometer to about 0.5 micrometer. As shown in FIG. 26A, the photosensitive dielectric layer PM1 is formed to cover the first conductive vias CV1 and the patterned bottom seed layers S', and the photosensitive dielectric layer PM1 has an undulating top surface.

Figure 26B:
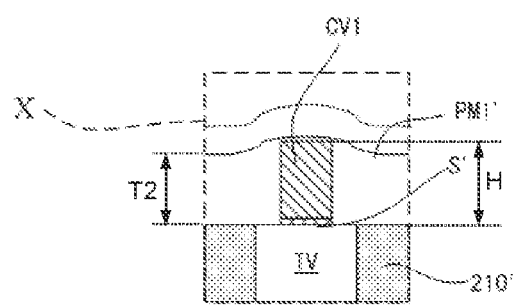

Referring to FIG. 26B, a first thinning process is performed to partially remove and thinned down the photosensitive dielectric layer PM1 such that a thinned photosensitive dielectric layer PM1' with a reduced thickness T2 is formed. In addition, the first thinning process may include at least one exposure and development process.

As shown in FIG. 26A and FIG. 26B, during the exposure and development process (e.g., the first thinning process), an upper portion of the photosensitive dielectric layer PM1 is irradiated by a light source (e.g., an UV light source) and a lower portion of the photosensitive dielectric layer PM1 is not irradiated by the light source. Then, the photosensitive dielectric layer PM1 is developed such that the upper portion of the photosensitive dielectric layer PM1 is removed and a thinned photosensitive dielectric layer PM1' (e.g., the remaining lower portion of the photosensitive dielectric layer PM1) is formed. The reduction in thickness of the photosensitive dielectric layer PM1 may be controlled by exposure dose and development time. In some embodiments, the exposure focus window (e.g., depth of focus) may be substantially equal to or greater than about 24 micrometers. For example, the exposure focus window may range from about −12 micrometers to about +12 micrometers.

After performing the first thinning process (e.g., UV exposure process), the first conductive vias CV1 are covered by the thinned photosensitive dielectric layer PM1'. The thickness T2 of the thinned photosensitive dielectric layer PM1' may be thicker than or substantially equal to that of the first conductive vias CV1. In some embodiments, during the first thinning process, the upper portion of the photosensitive dielectric layer PM1 may be exposed to the light source (e.g., an UV light source) and the exposure dose may range from about 100 mJ to about 150 mJ. Since the exposure dose provided to the upper portion of the photosensitive dielectric layer PM1 may range from about 100 mJ to about 150 mJ, the thinned photosensitive dielectric layer PM1' may have an undulating top surface and the thickness T2 of the thinned photosensitive dielectric layer PM1' may range from about 3.5 micrometers to about 5.25 micrometers, for example.

Figure 26C:
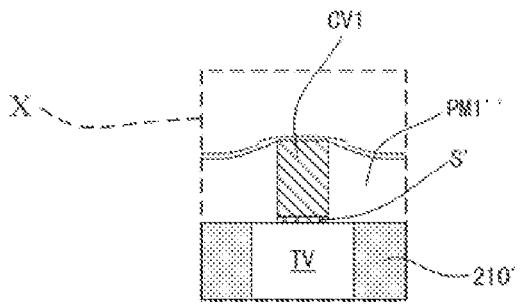

Referring to FIG. 26C, a second thinning process is performed to thin down the thinned photosensitive dielectric layer PM1' until the conductive vias CV1 are revealed. In some embodiments, the second thinning process includes an ash process. As illustrated in FIG. 26C, the photosensitive dielectric layer PM1' is partially removed by the ash process to form a photosensitive dielectric layer PM1", wherein the conductive vias CV1 are revealed by the photosensitive dielectric layer PM1". In some embodiments, the ash process (e.g., the second thinning process) is performed by a plasma treatment (e.g., $CF_4/O_2/Ar$ plasma) performed at a temperature ranging from about 25 Celsius degrees to about 150 Celsius degrees for a duration from about 30 seconds to about 600 seconds.

After forming the conductive vias CV1 and the photosensitive dielectric layer PM1" (shown in FIG. 26C), the processes illustrated in FIG. 15 through FIG. 21 may be performed to fabricate the redistribution circuit structure.

Figure 27A:
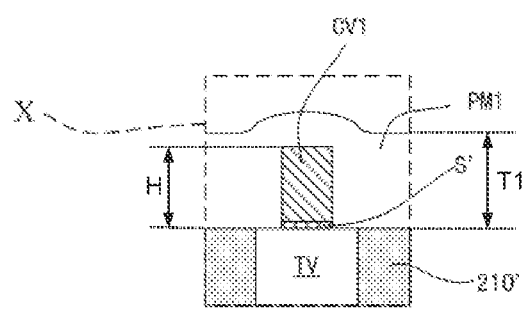

Referring to FIG. 27A, a photosensitive dielectric layer PM1 is formed to cover the first conductive vias CV1 and the patterned bottom seed layers S'. In some embodiments, the height of the first conductive vias CV1 may range from about 3 micrometers to about 5 micrometers, and the diameter of the first conductive vias CV1 may range from about 1 micrometer to about 5 micrometers. In some embodiments, the material of the photosensitive dielectric layer PM1 may include positive photoresist material such as photosensitive polyimide or the like. The thickness T1 of the photosensitive dielectric layer PM1 ranges from about 3.1 micrometers to about 5.5 micrometers, for example. Portions of the photosensitive dielectric layer PM1 which cover the top surfaces of the first conductive vias CV1 may have thickness ranging from about 0.1 micrometer to about 0.5 micrometer. As shown in FIG. 27A, the photosensitive dielectric layer PM1 is formed to cover the first conductive vias CV1 and the patterned bottom seed layers S', and the photosensitive dielectric layer PM1 has an undulating top surface.

Figure 27B:
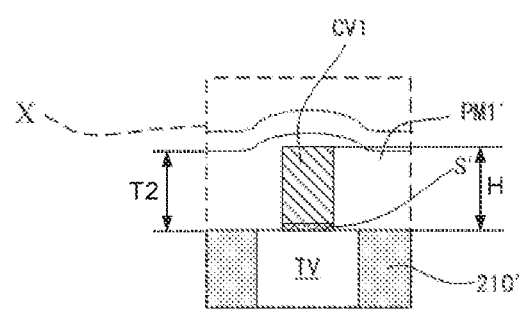

Referring to FIG. 27B, a first thinning process is performed to partially remove and thinned down the photosensitive dielectric layer PM1 such that a thinned photosensitive dielectric layer PM1' with a reduced thickness T2 is formed.

In addition, the first thinning process may include at least one exposure and development process.

As shown in FIG. 27A and FIG. 75B, during the exposure and development process (e.g., the first thinning process), an upper portion of the photosensitive dielectric layer PM1 is irradiated by a light source (e.g., an UV light source) and a lower portion of the photosensitive dielectric layer PM1 is not irradiated by the light source. Then, the photosensitive dielectric layer PM1 is developed such that the upper portion of the photosensitive dielectric layer PM1 is removed and a thinned photosensitive dielectric layer PM1' (e.g., the remaining lower portion of the photosensitive dielectric layer PM1) is formed. The reduction in thickness of the photosensitive dielectric layer PM1 may be controlled by exposure dose and development time. In some embodiments, the exposure focus window (e.g., depth of focus) may be substantially equal to or greater than about 24 micrometers. For example, the exposure focus window may range from about −12 micrometers to about +12 micrometers.

After performing the first thinning process (e.g., UV exposure process), the first conductive vias CV1 are covered by the thinned photosensitive dielectric layer PM1'. The thickness T2 of the thinned photosensitive dielectric layer PM1' may be thicker than or substantially equal to that of the first conductive vias CV1. In some embodiments, during the first thinning process, the upper portion of the photosensitive dielectric layer PM1 may be exposed to the light source (e.g., an UV light source) and the exposure dose may range from about 100 mJ to about 150 mJ. Since the exposure dose provided to the upper portion of the photosensitive dielectric layer PM1 may range from about 100 mJ to about 150 mJ, the thinned photosensitive dielectric layer PM1' may have an undulating top surface and the thickness T2 of the thinned photosensitive dielectric layer PM1' may range from about 3.5 micrometers to about 5.25 micrometers, for example.

Figure 27C:
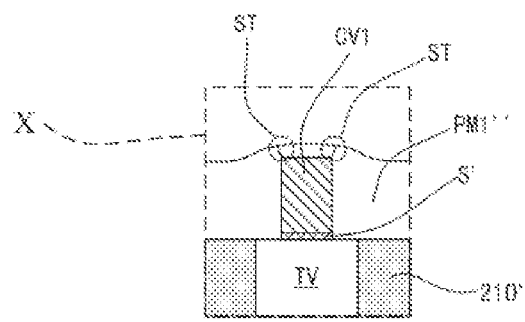

Referring to FIG. 27B and FIG. 27C, a second thinning process is performed to thin down the thinned photosensitive dielectric layer PM1' until the conductive vias CV1 are revealed. For example, the second thinning process includes a patterning process followed by a curing process. In some embodiments, as illustrated in FIG. 27C, a patterning process is performed on the photosensitive dielectric layer PM1' so as to form a patterned photosensitive dielectric layer PM1". The conductive vias CV1 are revealed by the patterned photosensitive dielectric layer PM1". After performing the patterning process, steps ST are generated between the top surfaces of the conductive vias CV1 and the top surface of the patterned photosensitive dielectric layer PM1". In some embodiments, the patterned photosensitive dielectric layer PM1" may be patterned by a photolithography process, wherein the photo-mask used in the photolithography process may enable the local exposure of the photosensitive dielectric layer PM1'.

Figure 27D:
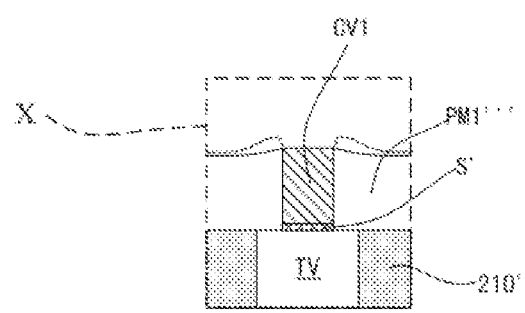
Figure 28A:
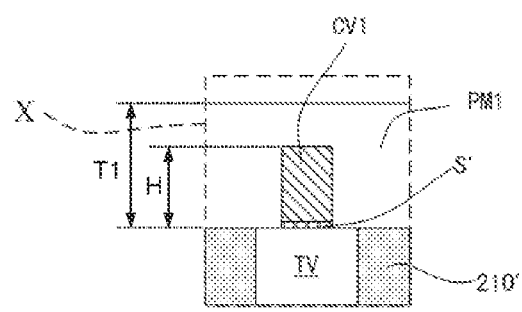
Figure 28B:
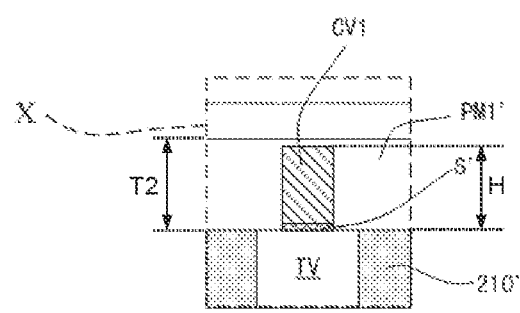
Figure 28C:
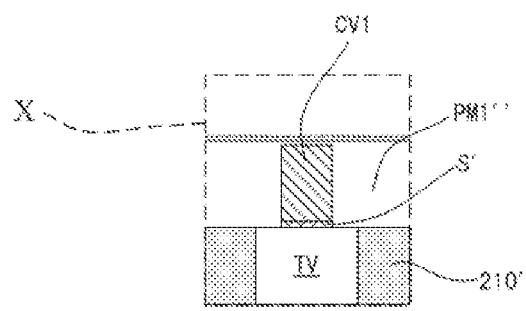
Figure 28D:
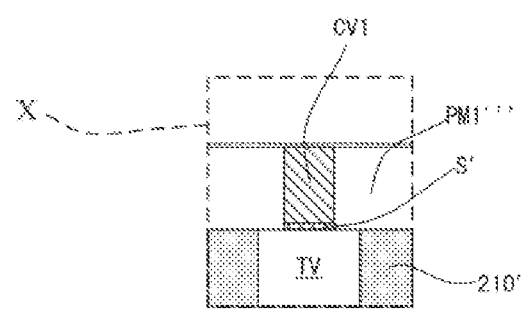

Referring to FIG. 27C and FIG. 27D, after performing the patterning process, the curing process of the second thinning process may be performed such that the patterned photosensitive dielectric layer PM1" shrinks and a cured photosensitive dielectric layer PM1'" having a reduced thickness is formed. For example, the curing process is performed under the curing temperature ranging from about 150 Celsius degrees to about 250 Celsius degrees for a duration from about 0.5 hour to about 2 hours. Since the curing process causes the shrinkage of the patterned photosensitive dielectric layer PM1", the steps ST between the top surfaces of the conductive vias CV1 and the patterned photosensitive dielectric layer PM1" may be minimized accordingly. In some embodiments, the height difference between the first conductive vias CV1 and the steps ST may range from about 0.1 micrometers to about 1.5 micrometers.

After forming the conductive vias CV1 and the photosensitive dielectric layer PM1'" (shown in FIG. 27D), the processes illustrated in FIG. 15 through FIG. 21 may be performed to fabricate the redistribution circuit structure.

Referring to FIGS. 28A through 28D, the fabrication processes as illustrated in FIGS. 28A through 28D is similar with those as illustrated in FIGS. 25A through 25D except that the photosensitive dielectric layer PM1 is thicker, the exposure dose for thinning the photosensitive dielectric layer PM1 is greater, and the top surfaces of the photosensitive dielectric layer PM1, PM1', PM1" and PM1'" are substantially flat surfaces. In an embodiment illustrated in FIGS. 28A through 28D, the thickness T1 of the photosensitive dielectric layer PM1 may range from about 3 micrometers to about 10 micrometers, the thickness T2 (e.g., about 3.5 micrometers to about 5.25 micrometers) of the thinned photosensitive dielectric layer PM1' may be slightly thicker than that of the first conductive vias CV1, and the exposure dose for thinning the photosensitive dielectric layer PM1 may range from about 200 mJ to about 450 mJ.

Figure 29A:
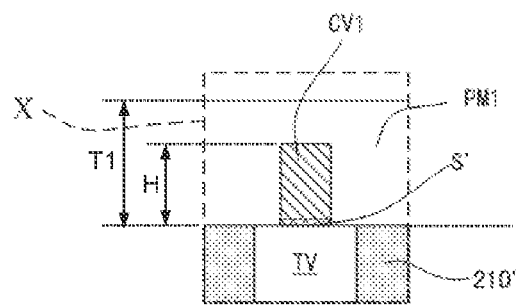
Figure 29B:
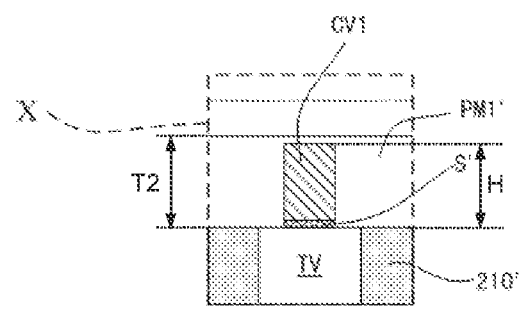
Figure 29C:
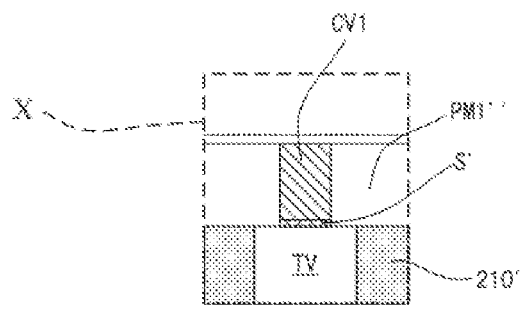
Figure 30A:
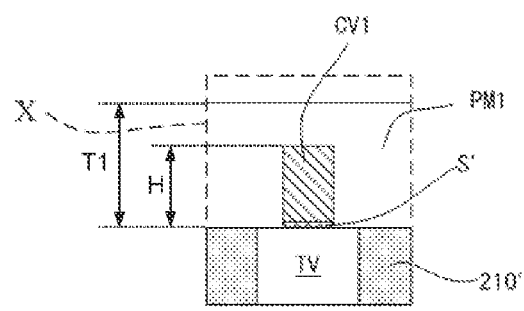
Figure 30B:
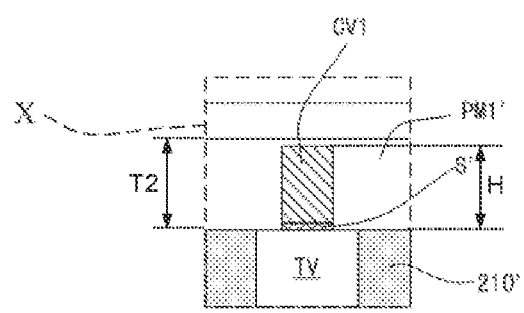
Figure 30C:
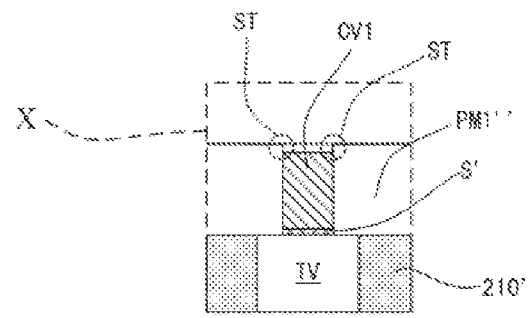
Figure 30D:
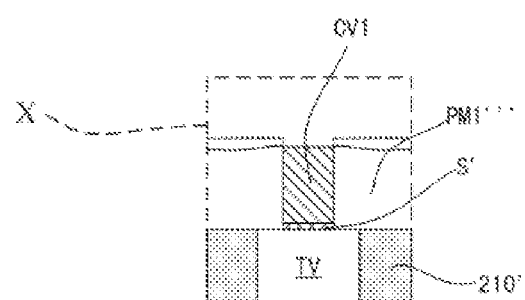

Referring to FIGS. 29A through 29C, the fabrication processes as illustrated in FIGS. 29A through 29C is similar with those as illustrated in FIGS. 26A through 26C except that the photosensitive dielectric layer PM1 is thicker, the exposure dose for thinning the photosensitive dielectric layer PM1 is greater, and the top surfaces of the photosensitive dielectric layer PM1, PM1' and PM1" are substantially flat surfaces. In an embodiment illustrated in FIGS. 29A through 29C, the thickness T1 of the photosensitive dielectric layer PM1 may range from about 3 micrometers to about 10 micrometers, the thickness T2 (e.g., about 3.5 micrometers to about 5.25 micrometers) of the thinned photosensitive dielectric layer PM1' may be slightly thicker than that of the first conductive vias CV1, and the exposure dose for thinning the photosensitive dielectric layer PM1 may range from about 200 mJ to about 450 mJ.

Referring to FIGS. 30A through 30D, the fabrication processes as illustrated in FIGS. 30A through 30D is similar with those as illustrated in FIGS. 27A through 27D except that the photosensitive dielectric layer PM1 is thicker, the exposure dose for thinning the photosensitive dielectric layer PM1 is greater, and the top surfaces of the photosensitive dielectric layer PM1, PM1' and PM1" are substantially flat surfaces. In an embodiment illustrated in FIGS. 30A through 30D, the thickness T1 of the photosensitive dielectric layer PM1 may range from about 3 micrometers to about 10 micrometers, the thickness T2 (e.g., about 3.5 micrometers to about 5.25 micrometers) of the thinned photosensitive dielectric layer PM1' may slightly thicker than that of the first conductive vias CV1, and the exposure dose for thinning the photosensitive dielectric layer PM1 may range from about 200 mJ to about 450 mJ. In some embodiments, the height difference between the first conductive vias CV1 and the steps ST illustrated in FIG. 30C may range from about 0.1 micrometers to about 1.5 micrometers.

In the above-described embodiments, since the photosensitive dielectric layer having the conductive vias embedded therein may be formed by at least one exposure and development process, the fabrication processes are cost effective and may enhance the productivity.

In accordance with some embodiments of the disclosure, a method of fabricating a redistribution circuit structure including the following steps is provided. A conductive via is formed. A photosensitive dielectric layer is formed to cover the conductive via. The photosensitive dielectric layer is thinned to reveal the conductive via, and thinning the photosensitive dielectric layer is performed at least through an exposure and development process. A redistribution wiring is formed on the photosensitive dielectric layer and the revealed conductive via after thinning the photosensitive dielectric layer.

In accordance with some embodiments of the disclosure, a method of fabricating a redistribution circuit structure including the following steps is provided. A conductive via is formed. A photosensitive dielectric layer is formed to cover the conductive via. An upper portion of the photosensitive dielectric layer is exposed and developed to form a first thinned photosensitive dielectric layer. A thinning process is performed on the first thinned photosensitive dielectric layer to form a second thinned photosensitive dielectric layer, wherein the conductive via is revealed after performing the thinning process. A first redistribution wiring is formed on the second thinned photosensitive dielectric layer and the revealed conductive via.

In accordance with some embodiments of the disclosure, a method of fabricating a redistribution circuit structure is provided. A conductive via is formed. A photosensitive dielectric layer is formed to cover the conductive via. A first thinning process is performed to thin the photosensitive dielectric layer to form a first thinned photosensitive dielectric layer, wherein the first thinning process comprises at least one exposure and development process. After performing the first thinning process, a second thinning process is performed to thin the first thinned photosensitive dielectric layer to form a second thinned photosensitive dielectric layer. After performing the second thinning process, a first redistribution wiring is formed on the second thinned photosensitive dielectric layer and the conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   an integrated circuit die;
   a molding compound along sidewalls of the integrated circuit die;
   a through via extending through the molding compound, wherein the molding compound extends between the integrated circuit die and the through via;
   a first polymer layer over the molding compound and the integrated circuit die, wherein an upper surface of the first polymer layer comprises a flat portion and a slope portion, wherein the slope portion is between the flat portion and the first conductive via, wherein the first conductive via protrudes above the flat portion;
   a first conductive via extending through the first polymer layer, wherein the first conductive via contacts the through via, wherein the first conductive via protrudes above the first polymer layer;
   a conductive line extending over the upper surface of the first polymer layer and an upper surface of the first conductive via; and
   a second polymer layer on the first polymer layer, wherein the second polymer layer contacts a sidewall and an upper surface of the conductive line.

2. The device of claim 1, wherein a thickness of the first polymer layer decreases as the first polymer layer extends away from the first conductive via.

3. The device of claim 1, wherein the conductive line contacts a sidewall of the first conductive via.

4. The device of claim 1, wherein the first conductive via has a height in a range from 0.1 micrometers to 2 micrometers.

5. The device of claim 1, wherein the integrated circuit die comprises a conductive pillar, further comprising a second conductive via extending through the first polymer layer, wherein the second conductive via contacts the conductive pillar, wherein the second conductive via protrudes above the first polymer layer.

6. The device of claim 1, wherein the first conductive via comprises a seed layer and a metal layer on the seed layer.

7. A semiconductor device comprising:
   an integrated circuit die;
   a molding compound along sidewalls of the integrated circuit die;
   a through via extending through the molding compound, wherein the molding compound extends between the integrated circuit die and the through via;
   a first insulating layer over the molding compound and the integrated circuit die, wherein the first insulating layer directly contacts an upper surface of the through via;
   a conductive via on the through via, the first insulating layer completely covering sidewalls of the conductive via, wherein an upper surface of the conductive via is recessed below an uppermost surface of the first insulating layer;
   a conductive line extending over the upper surface of the first insulating layer and the upper surface of the conductive via; and
   a second insulating layer on the first insulating layer, wherein the second insulating layer contacts a sidewall and an upper surface of the conductive line.

8. The device of claim 7, wherein the upper surface of the first insulating layer slopes downward as the first insulating layer approaches the conductive via.

9. The device of claim 7, wherein a width of the conductive via is less than a width of the through via.

10. The device of claim 7, wherein the first insulating layer is directly over the integrated circuit die.

11. The device of claim 7, wherein the conductive via has a height in a range from 0.1 micrometers to 2 micrometers.

12. The device of claim 7, wherein an upper surface of the first insulating layer extends upward and then downward as the first insulating layer extends away from the conductive via.

13. A semiconductor device comprising:
   an integrated circuit die;
   a molding compound along sidewalls of the integrated circuit die;
   a through via extending through the molding compound, wherein the molding compound extends between the integrated circuit die and the through via;
   a first insulating layer over the molding compound and the integrated circuit die;
   a conductive via on the through via, wherein an upper surface of the first insulating layer slopes upward as the upper surface of the first insulating layer extends away from the conductive via;

a conductive line extending over the upper surface of the first insulating layer and an upper surface of the conductive via; and a second polymer layer on the first insulating layer, wherein the second insulating layer contacts a sidewall and an upper surface of the conductive line.

14. The device of claim 13, wherein the upper surface of the first insulating layer slopes downward after sloping upward as the upper surface of the first insulating layer extends away from the conductive via.

15. The device of claim 13, wherein the conductive via comprises a seed layer and a metal layer over the seed layer.

16. The device of claim 13, wherein a thickness of the first insulating layer is in a range from 2 micrometers to 5 micrometers.

17. The device of claim 13, wherein an upper surface of the integrated circuit die is level with an upper surface of the conductive via.

18. The device of claim 13, wherein the first insulating layer directly contacts the through via and a contact pad of the integrated circuit die.

19. The device of claim 1, wherein the conductive line is a different layer than the first conductive via.

20. The device of claim 7, wherein the integrated circuit die comprises a conductive feature, wherein the first insulating layer directly contacts the conductive feature.

\* \* \* \* \*